(12) United States Patent
Chang et al.

(10) Patent No.: US 9,911,771 B2
(45) Date of Patent: Mar. 6, 2018

(54) RADIOGRAPHIC IMAGING ARRAY FABRICATION PROCESS FOR METAL OXIDE THIN-FILM TRANSISTORS WITH REDUCED MASK COUNT

(71) Applicant: Carestream Health, Inc., Rochester, NY (US)

(72) Inventors: Jeff Hsin Chang, San Jose, CA (US); Ravi K. Mruthyunjaya, Penfield, NY (US); Timothy J. Tredwell, Fairport, NY (US)

(73) Assignee: Carestream Health, Inc., Rochester, NY (US)

( * ) Notice: Subject to any disclaimer, the term of this patent is extended or adjusted under 35 U.S.C. 154(b) by 8 days.

(21) Appl. No.: 14/696,981

(22) Filed: Apr. 27, 2015

(65) Prior Publication Data

US 2015/0236062 A1 Aug. 20, 2015

Related U.S. Application Data

(63) Continuation of application No. 13/547,432, filed on Jul. 12, 2012, now Pat. No. 9,048,160.

(51) Int. Cl.
*H01L 27/14* (2006.01)
*H01L 27/146* (2006.01)
(Continued)

(52) U.S. Cl.
CPC .... *H01L 27/14616* (2013.01); *H01L 27/1288* (2013.01); *H01L 27/14659* (2013.01);
(Continued)

(58) Field of Classification Search
CPC .................................................. H04L 27/14616
See application file for complete search history.

(56) References Cited

U.S. PATENT DOCUMENTS 6,451,630 B2   9/2002   Lee
7,790,487 B2   9/2010   Shih et al.
(Continued)

FOREIGN PATENT DOCUMENTS

JP   2011-243745 A   12/2011
KR   20010051242     6/2001
(Continued)

OTHER PUBLICATIONS

International Search Report dated Oct. 21, 2013 for International Application No. PCT/US2013/049675, 3 pages.
(Continued)

*Primary Examiner* — Edwin Gunberg

(57) ABSTRACT

Embodiments of radiographic imaging systems; radiography detectors and methods for using the same; and/or fabrication methods therefore can include radiographic imaging array that can include a plurality of pixels that each include a photoelectric conversion element coupled to a thin-film switching element. In certain exemplary embodiments, thin-film switching element is a metal oxide (e.g., a-IGZO) TFT manufactured using a reduce photolithography mask counts. In certain exemplary embodiments, the thin-film switching element is a metal oxide (e.g., a-IGZO) TFT that includes reduced lower alignment tolerances between TFT electrodes. In certain exemplary embodiments, the thin-film switching element is a metal oxide (e.g., a-IGZO) TFT including a reduced thickness active layer.

22 Claims, 23 Drawing Sheets

(51) Int. Cl.
*H01L 29/786* (2006.01)
*H01L 29/66* (2006.01)
*H01L 27/12* (2006.01)

(52) U.S. Cl.
CPC .. *H01L 27/14689* (2013.01); *H01L 27/14692* (2013.01); *H01L 29/66969* (2013.01); *H01L 29/78603* (2013.01); *H01L 29/78693* (2013.01)

(56) References Cited

U.S. PATENT DOCUMENTS

| | | |
|---|---|---|
| 8,213,573 B2 | 7/2012 | Liu et al. |
| 2001/0003657 A1 | 6/2001 | Lee |
| 2003/0025444 A1 | 2/2003 | Seo et al. |
| 2006/0145158 A1* | 7/2006 | Noguchi ............. H01L 29/4908 257/66 |
| 2009/0021661 A1 | 1/2009 | Tsuboi |
| 2009/0159887 A1* | 6/2009 | Huh ................. H01L 29/41733 257/59 |
| 2011/0255666 A1 | 10/2011 | Liu et al. |

FOREIGN PATENT DOCUMENTS

| | | |
|---|---|---|
| KR | 20020045020 | 6/2002 |
| KR | 20070000802 | 1/2007 |

OTHER PUBLICATIONS

Supplementary European Search Report for EP Application No. EP 13 81 7236, dated Feb 3, 2016, 2 pages.

\* cited by examiner

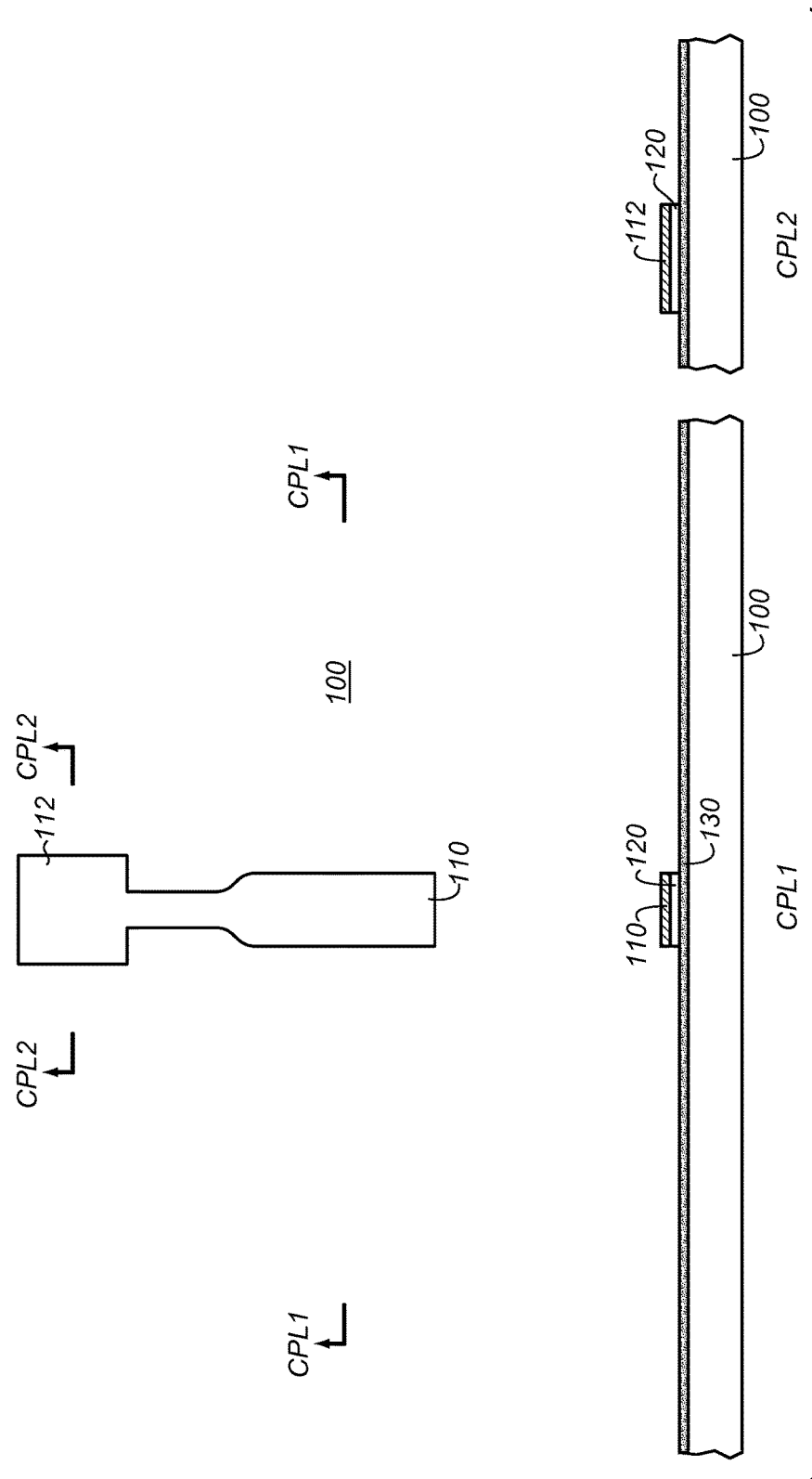

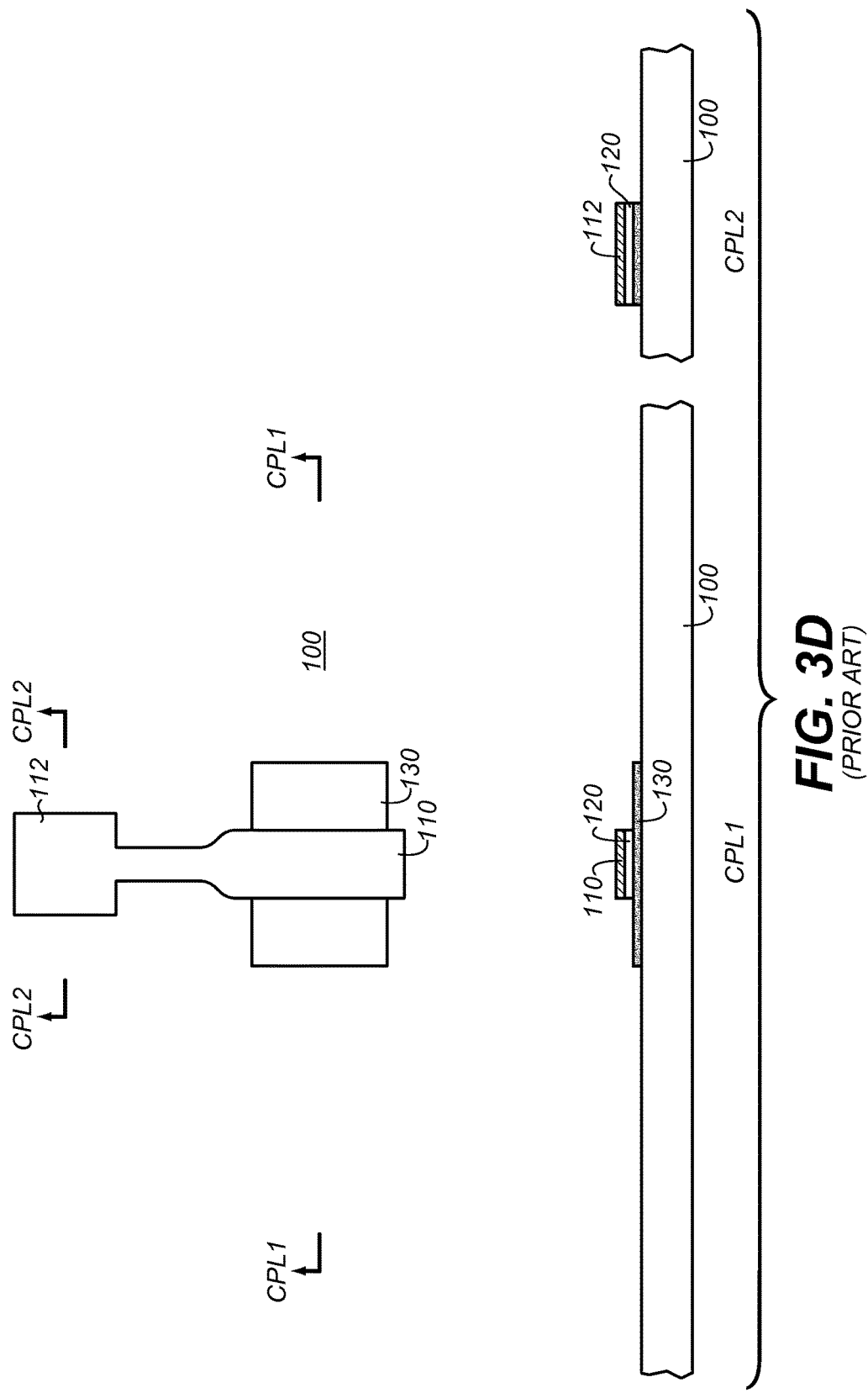
FIG. 3D *(PRIOR ART)*

RADIOGRAPHIC IMAGING ARRAY FABRICATION PROCESS FOR METAL OXIDE THIN-FILM TRANSISTORS WITH REDUCED MASK COUNT

CROSS REFERENCE TO RELATED APPLICATIONS

This application is a Continuation of earlier filed application U.S. Ser. No. 13/547,432, filed on Jul. 12, 2012, entitled "RADIOGRAPHIC IMAGING ARRAY FABRICATION PROCESS FOR METAL OXIDE THIN-FILM TRANSISTORS WITH REDUCED MASK COUNT", in the names of Jeff Hsin Chang et al.

FIELD OF THE INVENTION

The invention relates generally to the field of radiation conversion apparatus, and in particular to medical radiographic imaging and digital radiographic (DR) detectors, and more particularly to fabrication processes for thin-film transistors (TFTs) using non-single crystalline semiconductor materials such as disordered metal-oxide semiconductor as an active layer.

BACKGROUND

Thin-film transistors (TFT) are used as one of the fundamental building blocks for current large-area electronics. Amorphous silicon (a-Si) TFTs usually serve as electrical switches for large-area liquid-crystal displays (LCD) and large-area flat-panel imagers (FPD); they are well known in the art of large-area electronics fabrication. A typical TFT has three terminals: gate, source, and drain. A majority of the charge carriers flow between the source and drain terminal through a semiconducting layer (referred to as an active layer). The degree of conduction of the semiconducting layer between the source and drain terminal is controlled by the potential of the gate terminal. The source and drain terminal is usually identified by the type carrier responsible for the main conduction current flow. Further, the TFTs can be made geometrically symmetric and therefore the distinction between source and drain is only made by its electrical potential difference and the type of charge carrier the transistor uses for conduction. Therefore, the two terminals are often referred together as the source/drain (SD) terminals. For the purpose of this application, the source and drain terminals are not separately identified to be distinct, but that is not intended to limit the scope of the application.

For large size radiographic imaging arrays, TFTs are typically used as a switching element in pixels within a radiographic imaging array. To those of ordinary skill in the art, it is immediately evident that there are numerous other possible choices for the switching elements as well as types of materials that can compose the elements. There is a need to improve performance characteristics of TFTs included in large-size radiographic imaging arrays, digital radiographic (DR) detectors and methods for using the same.

SUMMARY OF THE INVENTION

An aspect of this application is to advance the art of medical digital radiography.

Another aspect of this application to address in whole or in part, at least the foregoing and other deficiencies in the related art.

It is another aspect of this application to provide in whole or in part, at least the advantages described herein.

An aspect of this application is to provide methods and/or apparatus to address and/or reduce disadvantages caused by the use of portable (e.g., wireless) digital radiography (DR) detectors and/or radiography imaging apparatus using the same.

An aspect of this application is to provide radiographic imaging apparatus and/or methods for making the same that can reduce a number of processing operations or use a lower photolithography mask count in a fabrication process for TFT.

An aspect of this application is to provide radiographic imaging apparatus and/or methods that can use smaller alignment tolerances for TFTs or reduce alignment tolerances between TFT electrodes.

An aspect of this application is to provide radiographic imaging apparatus fabrication process that can reduce photolithography mask counts or photolithography mask steps for TFT devices, require lower alignment tolerances between the TFT electrodes, and/or use a reduced thickness active layer in TFT devices.

An aspect of this application to is to provide radiographic imaging methods and/or apparatus that can reduce parasitic capacitances than can hinder the dynamic performance of TFT devices used in a radiographic imaging array.

In accordance with one embodiment, the present invention can provide a method of manufacturing a digital radiographic detector, the radiographic detector including an imaging array comprising a plurality of pixels arranged in rows and columns, each pixel including a photosensor configured to generate a signal based upon radiation received, the method can include forming an insulating substrate; forming a thin-film transistor in each of the plurality of pixels coupled to a photosensor, including, forming a metal-oxide semiconductor active layer and a gate insulator layer over the insulating substrate, patterning the gate insulator layer using a first photolithography mask, forming a conductive layer comprising metal over the gate insulator layer and selected exposed portions of the metal-oxide semiconductor active layer, patterning the conductive layer using a second photolithography mask to form control electrode, first electrode and second electrode, forming a protective layer over the electrodes and the exposed gate insulator layer, and patterning the protective layer using a third photolithography mask to expose a portion of the electrodes for electrical connection.

In accordance with one embodiment, the present invention can provide a digital radiographic area detector that can include a housing configured to include an upper surface, a lower surface, and side surfaces to connect the upper surface and the lower surface; an insulating substrate inside the housing; an imaging device mounted inside the housing on the insulating substrate, the imaging device comprising a plurality of pixels, each pixel comprising at least one electrically chargeable photosensor and at least one thin-film transistor (TFT); a bias control circuit to provide a bias voltage to the photosensors for a portion of the imaging array; an address control circuit to control scan lines, where each of the scan lines is configured to extend in a first direction and is coupled to a plurality of pixels in the portion of the imaging array; and a signal sensing circuit connected to data lines, where each of the data lines is configured to extend in a second direction and is coupled to at least two pixels in the portion of the imaging array; where the at least one TFT comprises a metal oxide semiconductor active layer and a co-planar gate electrode, source electrode and drain electrode positioned in a single identical conductive metal layer.

These objects are given only by way of illustrative example, and such objects may be exemplary of one or more embodiments of the invention. Other desirable objectives and advantages inherently achieved by the disclosed invention may occur or become apparent to those skilled in the art. The invention is defined by the appended claims.

BRIEF DESCRIPTION OF THE DRAWINGS

The foregoing and other objects, features, and advantages of the invention will be apparent from the following more particular description of the embodiments of the invention, as illustrated in the accompanying drawings.

The elements of the drawings are not necessarily to scale relative to each other.

FIGS. 3A-3G are diagrams that show top-down views and cross-sectional views of processing operations for a conventional coplanar TFT architecture.

DESCRIPTION OF EXEMPLARY EMBODIMENTS

Figure 1A:
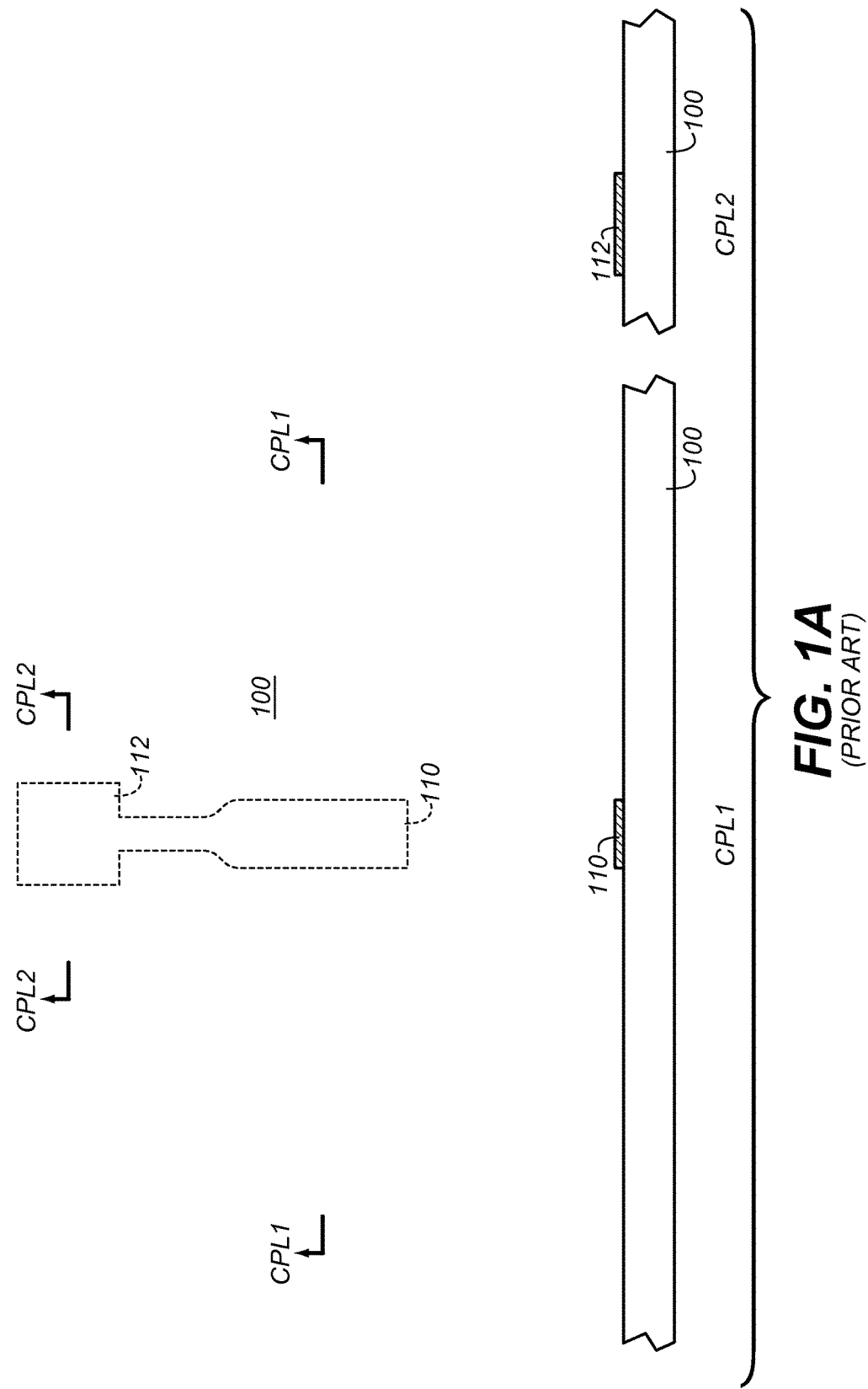
FIGS. 1A-1G are diagrams that show top-down views and cross-sectional views of processing operations for a conventional BCE inverted-staggered TFT architecture.

The following is a description of exemplary embodiments of the invention, examples of which are illustrated in the accompanying drawings. Wherever possible, the same reference numbers will be used throughout the drawings to refer to the same or like parts.

For simplicity and illustrative purposes, principles of the invention are described herein by referring mainly to exemplary embodiments thereof. However, one of ordinary skill in the art would readily recognize that the same principles are equally applicable to, and can be implemented in, all types of radiographic imaging arrays, various types of radiographic imaging apparatus and/or methods for using the same and that any such variations do not depart from the true spirit and scope of the application. Moreover, in the following description, references are made to the accompanying figures, which illustrate specific exemplary embodiments. Electrical, mechanical, logical and structural changes can be made to the embodiments without departing from the spirit and scope of the invention. In addition, while a feature of the invention may have been disclosed with respect to only one of several implementations/embodiments, such feature can be combined with one or more other features of other implementations/embodiments as can be desired and/or advantageous for any given or identifiable function. The following description is, therefore, not to be taken in a limiting sense and the scope of the invention is defined by the appended claims and their equivalents.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. Where they are used, the terms "first", "second", and so on, do not necessarily denote any ordinal or priority relation, but may be used for more clearly distinguishing one element or time interval from another.

There are a number of transistor architectures used for radiographic imaging and each has corresponding advantages. The most widely used TFT architecture in the large-area electronics industry is the back-channel etch (BCE) inverted-staggered TFT.

FIGS. 1A-1G shows a typical fabrication process of the BCE inverted-staggered TFT architecture. The BCE inverted-staggered TFT process is often used for fabricating hydrogenated amorphous silicon (a-Si:H) TFTs. The BCE inverted-staggered TFT architecture is sometimes referred to as the bottom-gate architecture because a gate electrode 110 is formed in closer proximity to an insulating substrate 100 than an active semiconductor layer 130. FIGS. 1A-1G show device top views and device cross sections, respectively, for the described processing steps. CPL1 and CPL2 indicate the cutting-planes used for the cross-sections. CPL1 shows the device cross-sectional diagram for the TFT and the SD probe pads while CPL2 shows the cross-sectional diagram for the gate probe pad.

Referring to FIG. 1A, a metal layer for the gate electrode 110 that controls the electrical conductivity of the active semiconductor island is first deposited on an electrically insulating substrate 100. The metal layer is pattered by a photolithography mask as known in the art to form the gate electrode 110 and part of the gate probe pad 112 for the TFT gate terminal. The resulting structure is shown in FIG. 1A.

Figure 1B:
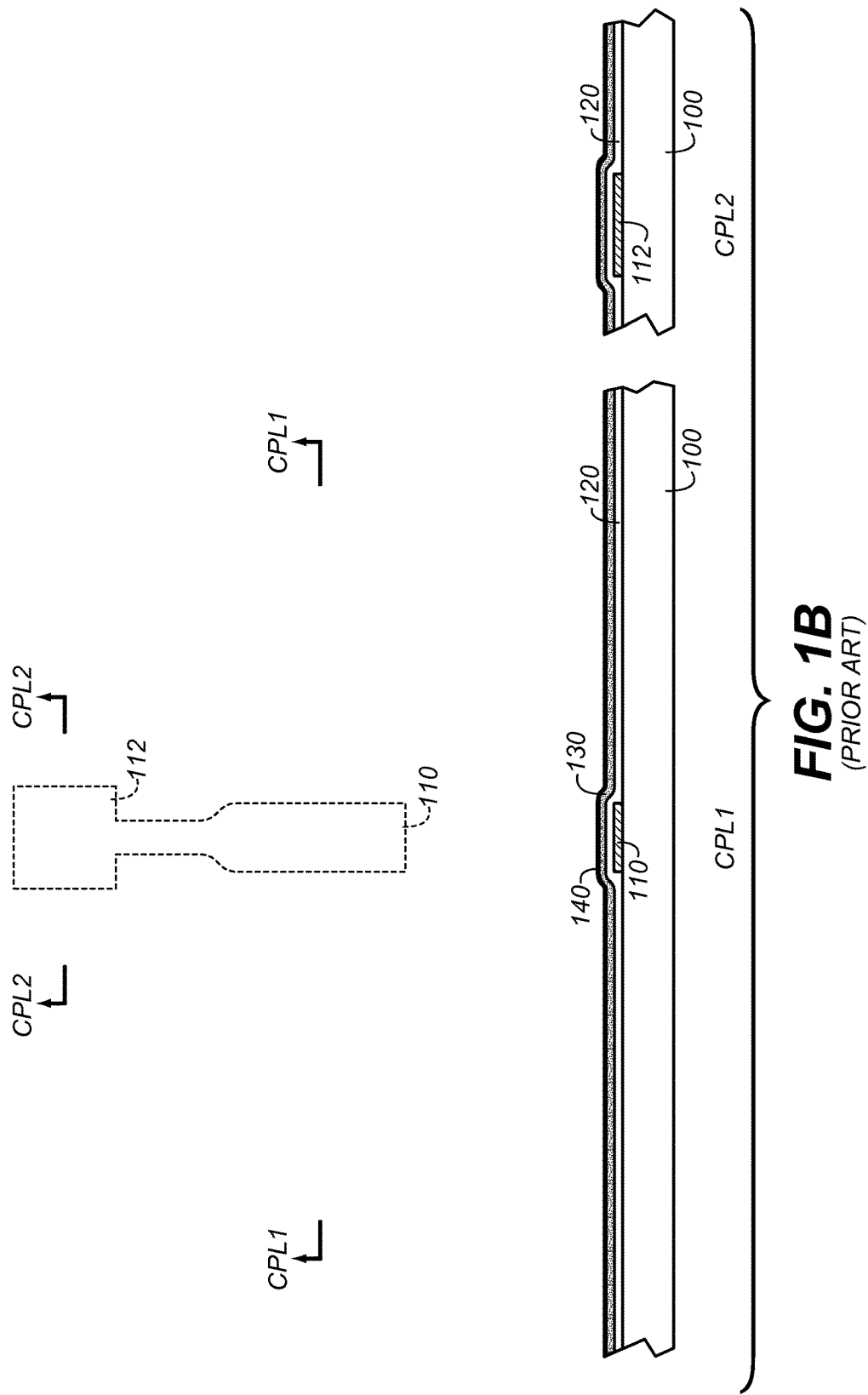

Referring to FIG. 1B, an insulating layer 120, an active semiconductor layer 130, and a contact layer (e.g., doped semiconductor layer) 140 are then consecutively deposited over the substrate 100 to cover the patterned gate electrode 110 and portions of the gate probe pad 112. This step is sometimes referred to as the "tri-layer deposition step" well known in the art. The deposited insulator layer 120 is also referred to as the gate insulator layer or the gate dielectric layer. The insulator layer 120 is important as the gate electrode 110 must not be in direct contact with the active semiconductor layer 130. One skilled in the art of TFT fabrication would also recognize the importance of consecutive deposition of the tri-layer structure to reduce or minimize interface defects between the layers 120, 130, 140. Consecutive deposition can be especially relevant to the interface between the gate insulator layer 120 and the active semiconductor layer 130 as the interface quality (e.g., interface defects) can significantly affect the performances of the resulting TFT. The resulting structure after this fabrication step is shown in FIG. 1B. For clarity, both the active semiconductor layer 130 and the contact layer 140 are omitted from the top view in FIG. 1B.

Figure 1C:
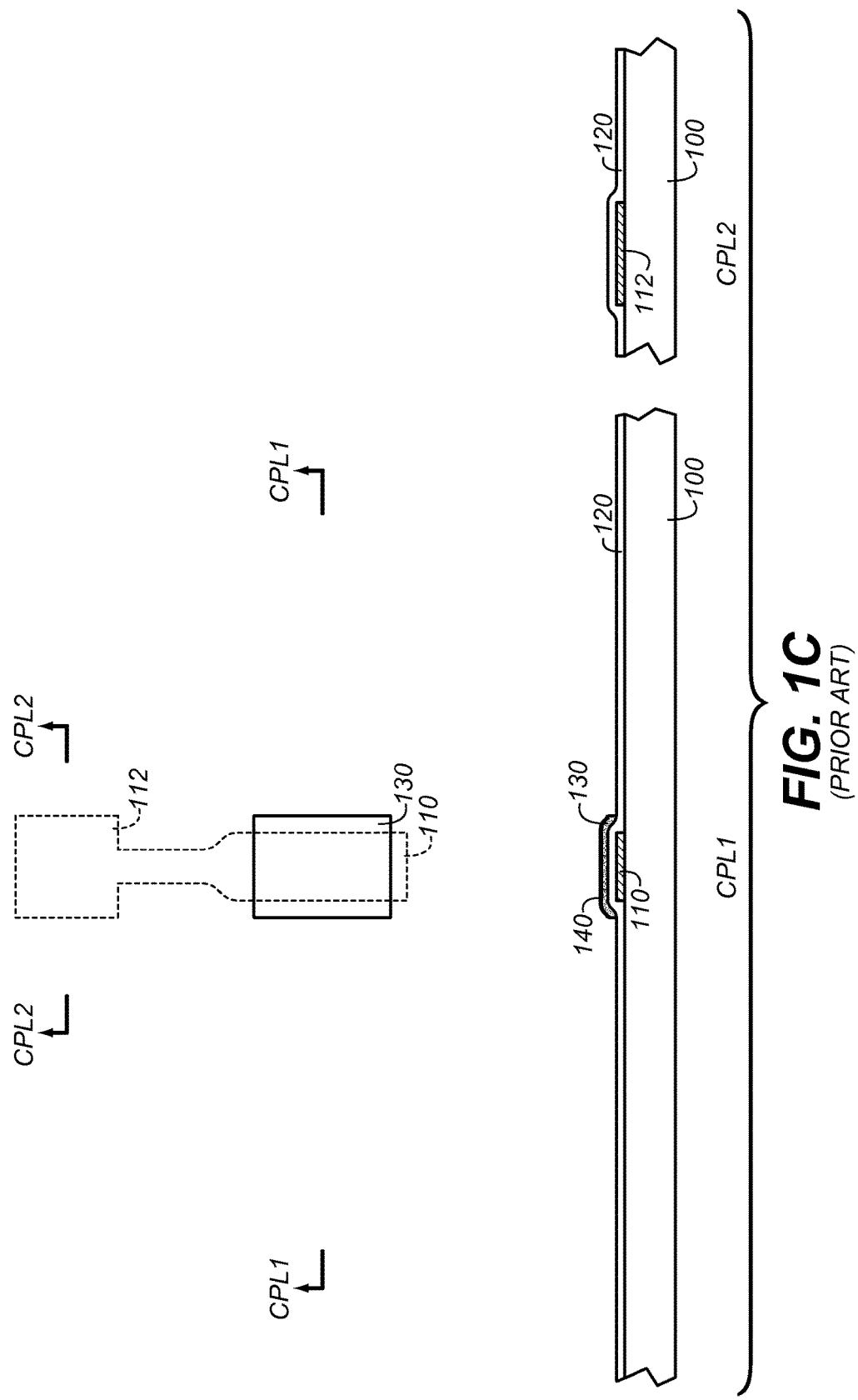
Figure 1D:
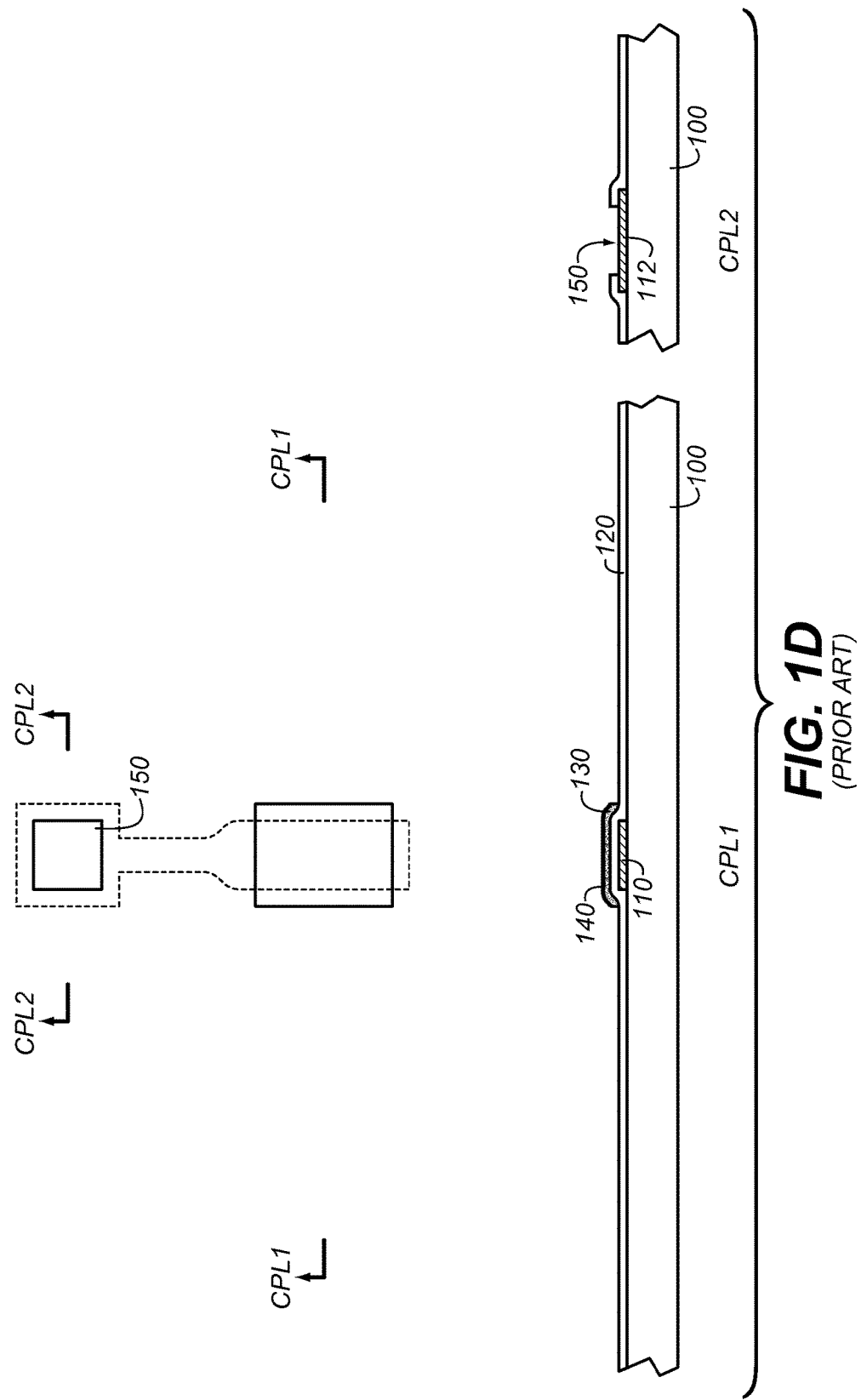

The active semiconductor layer 130 and the doped contact layer 140 are then patterned using a second photolithography mask to form the active semiconductor island as shown in FIG. 1C. The active semiconductor island is usually aligned to the gate electrode 110. For clarity, the doped contact layer 140 is omitted in the top view shown in FIG. 1C because the doped contact layer 140 edges overlap the active semiconductor layer 130. At this stage, the gate insulator layer 120 can be patterned to open a probe pad window for the gate electrode 150 using a third photolithography mask as shown in FIG. 1D by the cross-section along CPL2.

Figure 1E:
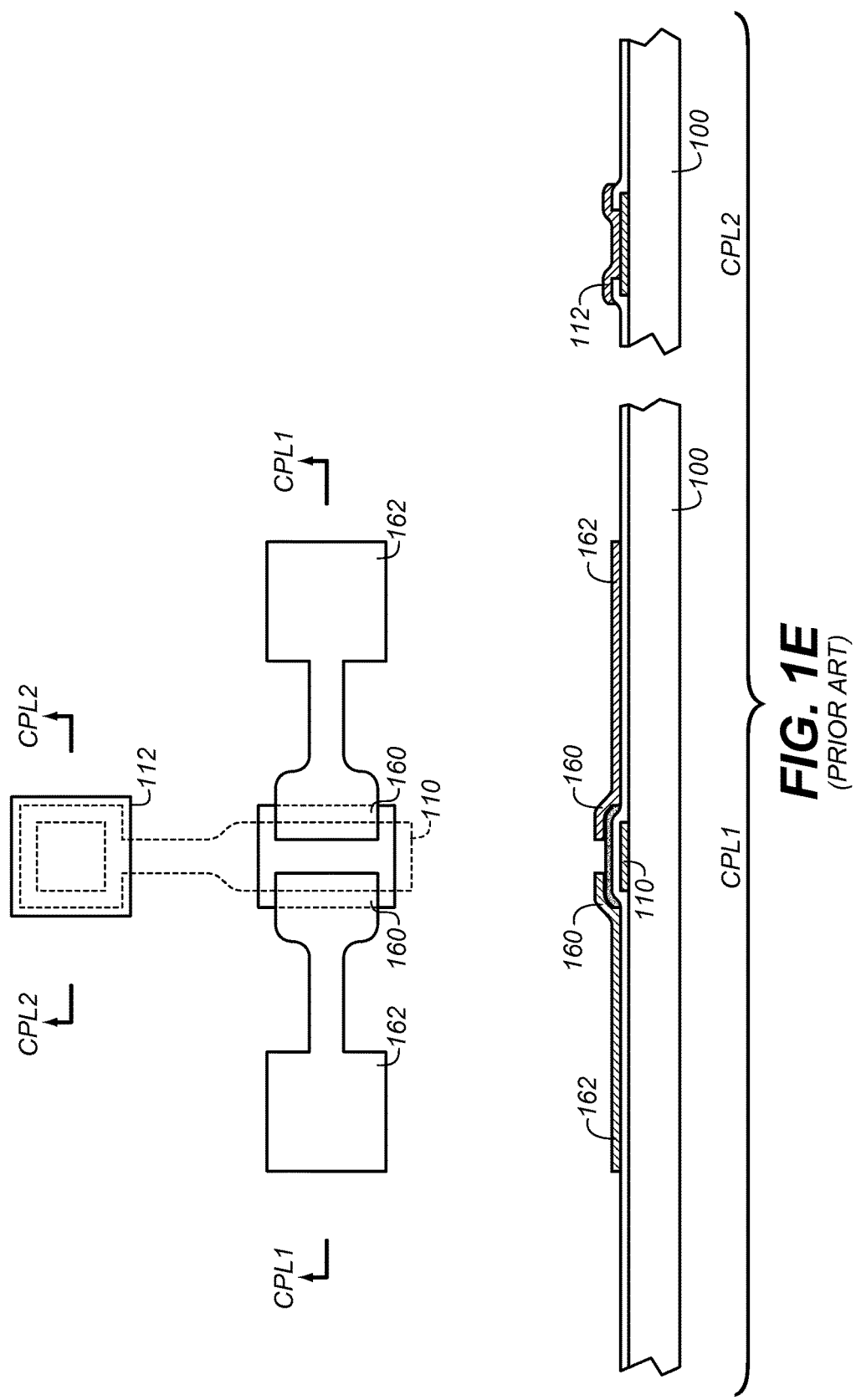
Figure 1F:
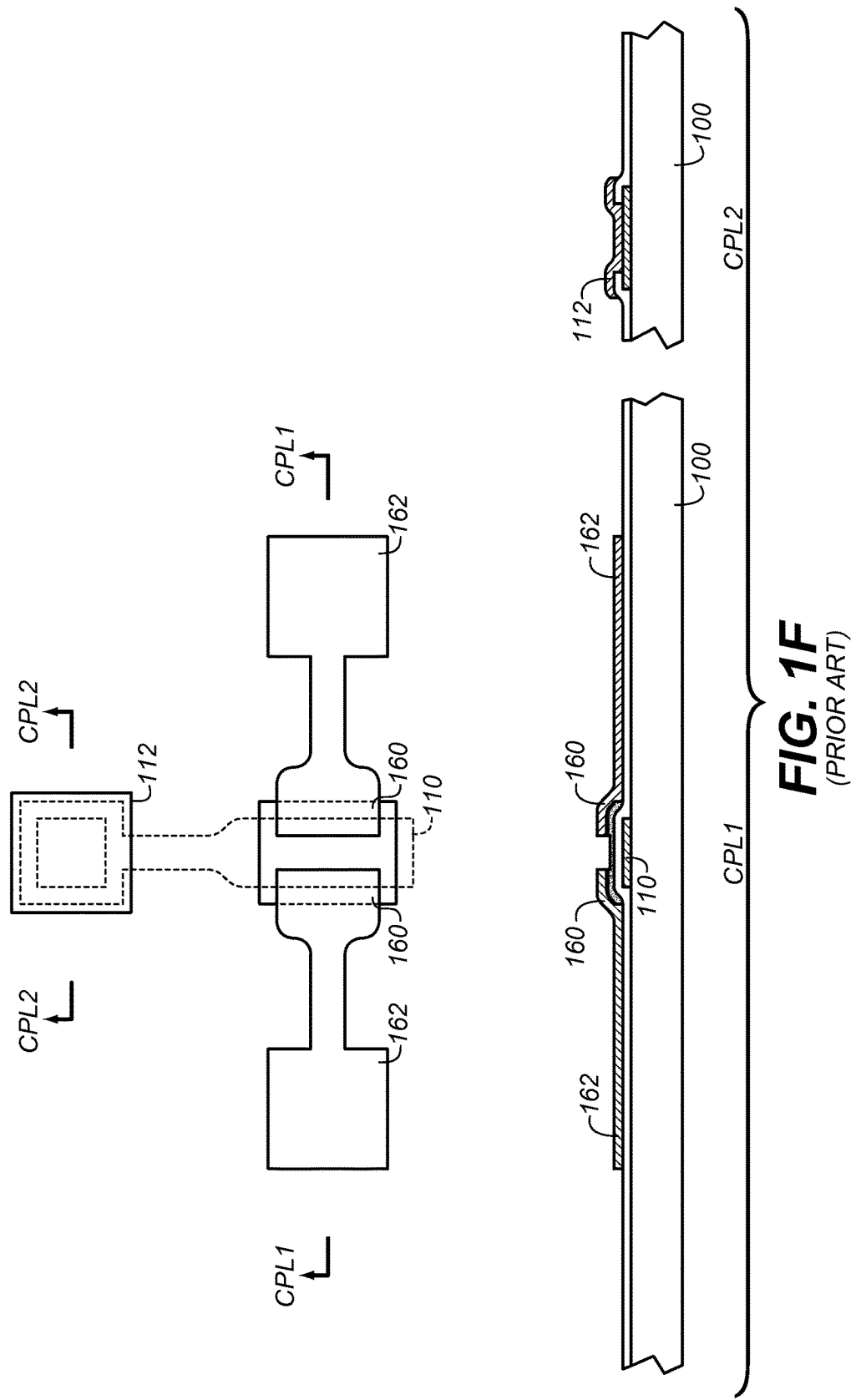

Referring to FIG. 1E, the source and drain electrodes 160 of the TFT are then formed by depositing a second metal layer across the entire substrate covering previously formed features then followed by photolithography using a fourth mask. The source and drain probe pads 162 are also formed during using the second metal layer as shown in FIG. 1E. The second metal layer is patterned such that near the region of the gate electrode probe pad 112, metal also exists (e.g., remains) and completely covers the gate electrode probe pad window 150 to provide an electrical connection between the first patterned metal layer and the second patterned metal layer. The combination of the two metal layers (e.g., first patterned metal layer and the second patterned metal layer) forms the gate electrode probe pad 112 as shown by cross-section along CPL2 in FIG. 1E.

After patterning the second metal layer to form the source and drain electrodes, a selective etch process is performed to completely remove the doped contact layer 140 in regions not covered by the source drain metal, which includes the region between the source and drain terminals 160 usually referred to as the channel region. To guarantee complete removal of the doped contact layer 140 in the channel region, the active semiconductor layer 130 not covered by the source and drain electrode 160 is partially etched as well thereby forming a shallow trench. The shallow trench in the channel region causes the thickness of the active semiconductor material underneath the source and drain electrodes 160 to be different than the thickness of the active material in the channel region (and in other regions of the active island not covered by the second metal layer). This is as shown by cross-section along CPL1 in FIG. 1F and this selective etch process step is commonly referred to as BCE process; thus, giving the TFT architecture the name BCE inverted-staggered TFT.

Figure 1G:
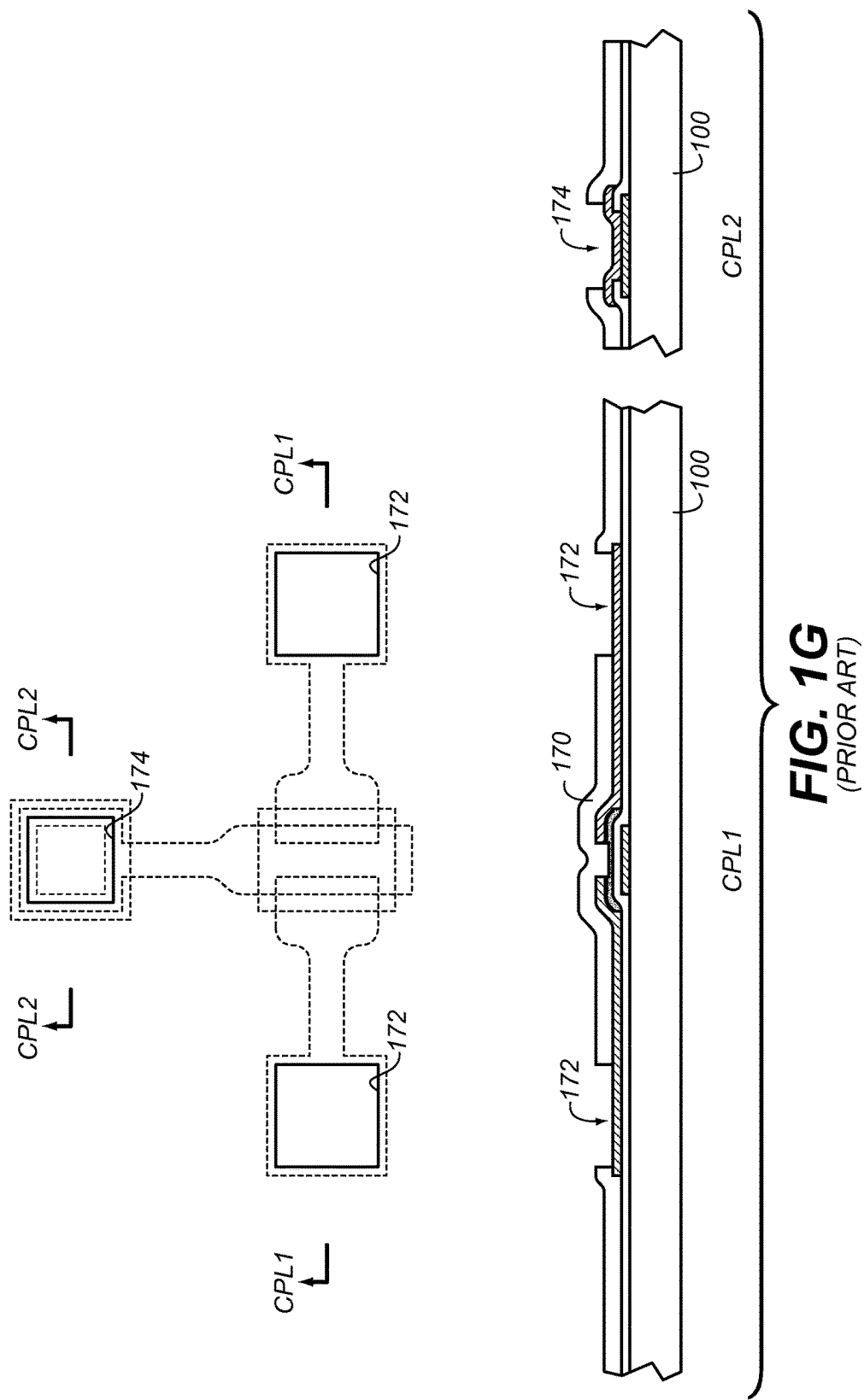

Referring to FIG. 1G, the resulting structure is often encapsulated by a thick encapsulation layer 170 to prevent undesirable effects caused by ambient environmental conditions. The encapsulation layer 170 is deposited across the entire substrate 100 covering previously formed features. The encapsulation layer 170 also serves as a passivation layer to mediate damage caused by the BCE process. Since the encapsulation layer 170 is also an electrical insulator, portions of the encapsulation layer 170 must be removed in probe pad or contact window areas using a fifth photolithography mask in order to provide or obtain electrical contact with the TFT terminals. The resulting structure is shown in FIG. 1G where the gate probe pad window 174 and source and drain probe pad windows 172 are formed by etching away the passivation layer 170 in these regions. At this point, the BCE inverted-staggered TFT fabrication process is complete and it is noted that a total of five photolithography masks are used.

Figure 2:
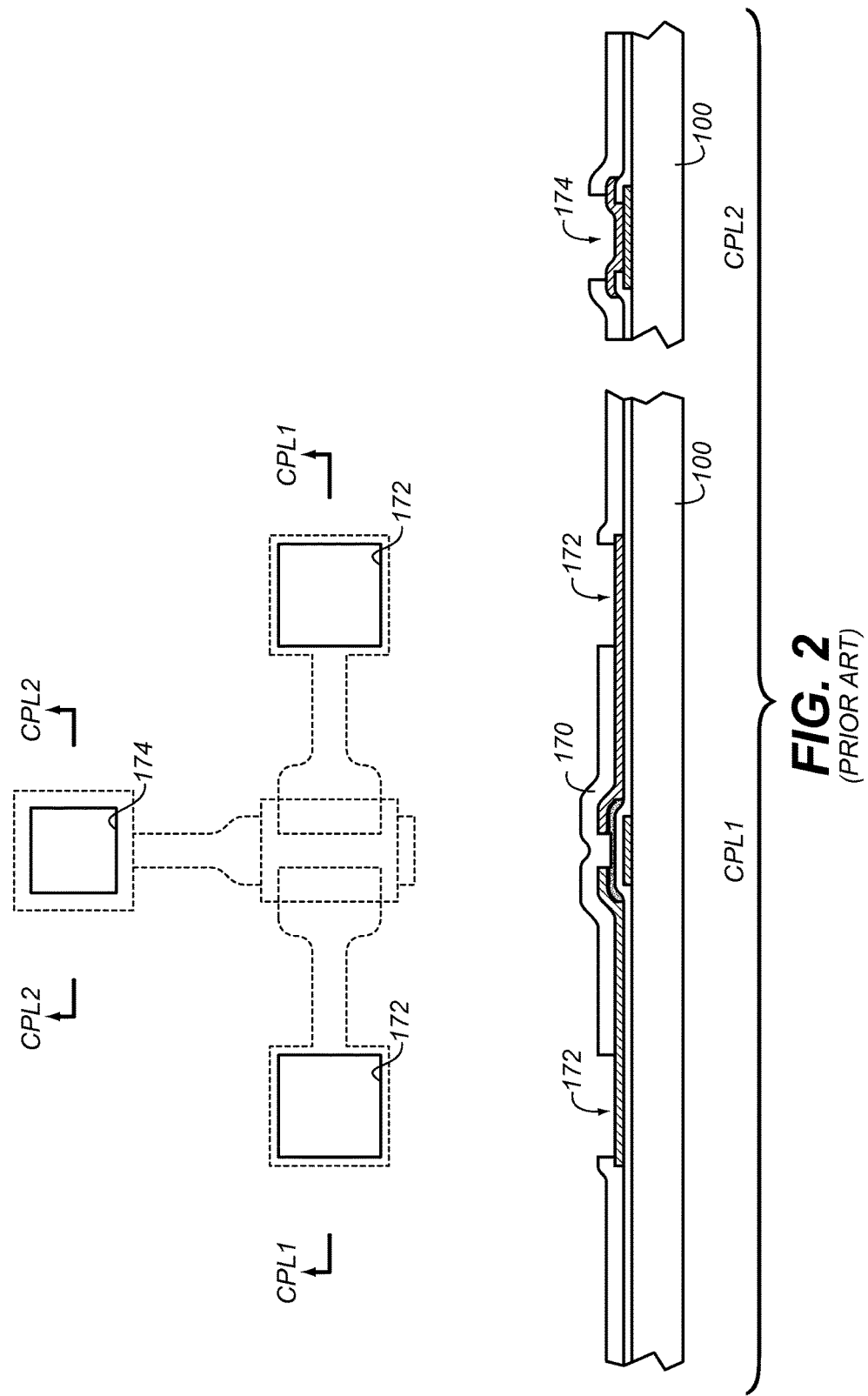
FIG. 2 is a diagram that shows top-down views and cross-sectional views of another conventional BCE inverted-staggered TFT architecture.

Use of the third photolithography mask/step shown in FIG. 1D can be optional when the gate dielectric material 120 can be etched along with the passivation layer 170 etch. When the third photolithography mask is omitted and the gate electrode probe pad contact window 174 is etched by the fifth photolithography mask, then resulting structure is shown in FIG. 2. For the structure shown in FIG. 2, the total number of photolithography masks is reduced to four.

The BCE TFT fabrication process introduces a number of constraints to the active semiconductor layer 130 properties. The BCE TFT fabrication process sacrifices the flexibility of the active semiconductor layer 130 options to reap the benefit of a reduced mask count. One constraint is the thickness of the active layer. When the active layer 130 is too thin, there is only a small timing window during the BCE fabrication process before the active layer is completely etched though (e.g., in the channel region); under such circumstances no transistor action would occur for the fabricated structure. However, a thinner active layer 130 is preferred because a thicker active layer can lead to higher resistances and/or reduce the apparent carrier mobility. Another constraint is the etch selectivity between the active semiconductor layer 130 and the source/drain (SD) electrode metal layer material. For the BCE TFT fabrication process, the etch selectivity needs to be sufficiently high; otherwise, the active island material can be completely removed even prior to the BCE process during the patterning of the source and drain electrodes 160 (process step illustrated in FIG. 1E). Thus, the BCE TFT fabrication process can not use metal oxide semiconductors, such as amorphous indium gallium zinc oxide (a-IGZO) as the active layer 130. Since a-IGZO reacts with many metal etchants, a desired high etch selectivity can not be achieved during the patterning for the source and drain metal layer. To address the high etch selectivity requirement, an additional protective layer can be introduced prior to the patterning of the SD electrode metal. The additional protective layer is also often referred to as an etch-stopper (ES) layer because it operates to reduce or prevent the etching agent used for patterning the SD metal from attacking the active layer 130. However, for the inverted-staggered TFT architectures, the introduction of the ES layer requires the use of at least one additional photolithography mask to pattern the ES layer. Another constraint placed by the BCE fabrication process is that the active semiconductor layer 130 must be sufficiently thick. The thickness of the active semiconductor layer 130 not only must allow for process tolerances during the back-channel etch, but also must ensure satisfactory step coverage over the topology introduced by the underlying gate electrode 110.

The constraint issues described above can be avoided using a coplanar TFT architecture. For coplanar TFTs, the active semiconductor layer 130 is formed prior to forming the gate electrode 110. Forming the active semiconductor layer 130 before the gate electrode 110 can avoid the active semiconductor layer 130 having to traverse through the topology introduced by the gate electrode 110. Further, the insulator layers deposited prior to metal patterning can also function as an ES layer, which can relax the constraints placed on the active layer 130. To illustrate this, a typical coplanar metal oxide TFT process is shown FIGS. 3A-3F.

Figure 3A:
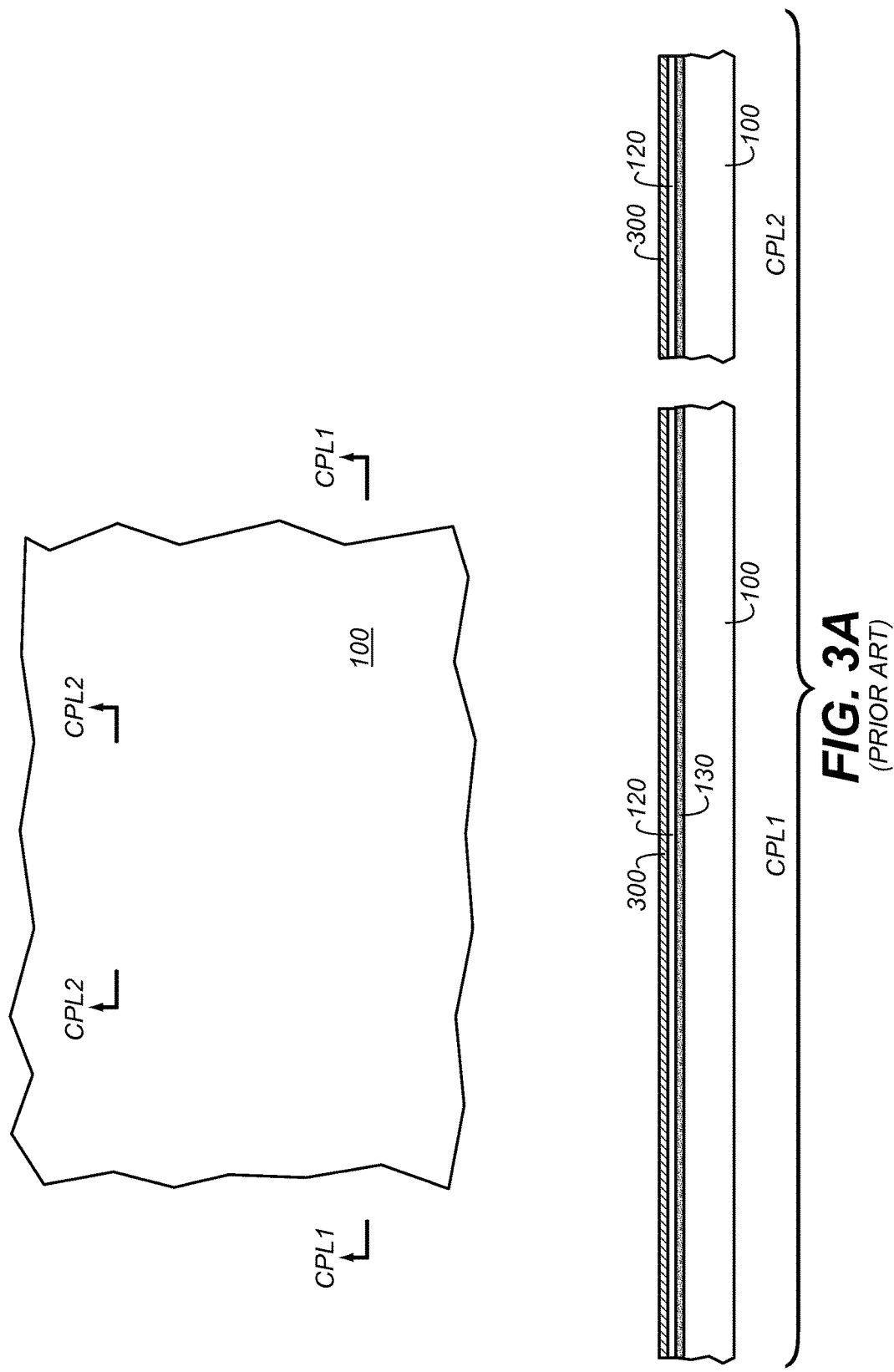

Referring to FIG. 3A, the active layer 130, the gate insulator layer 120, and the gate metal layer 300, are initially deposited over an insulating substrate 100. The resulting structure after this fabrication step is shown in FIG. 3A. The three deposited layers are omitted in the top-down view in FIG. 3A for clarity. Then, using a first photolithography mask, the gate metal layer 300 is patterned to form the gate electrode 110 and the gate probe pad 112. The resulting structure after this fabrication step is shown in FIG. 3B. Since the gate insulator layer 120 is covering the active layer 130 completely during the formation of the gate electrode 110, the active layer material is not attacked by the etching agent for the gate metal layer 300. The active layer 130 and the gate insulator layer 120 are again omitted in the top view in FIG. 3B for clarity because they both cover the entire insulating substrate 100.

Figure 3C:
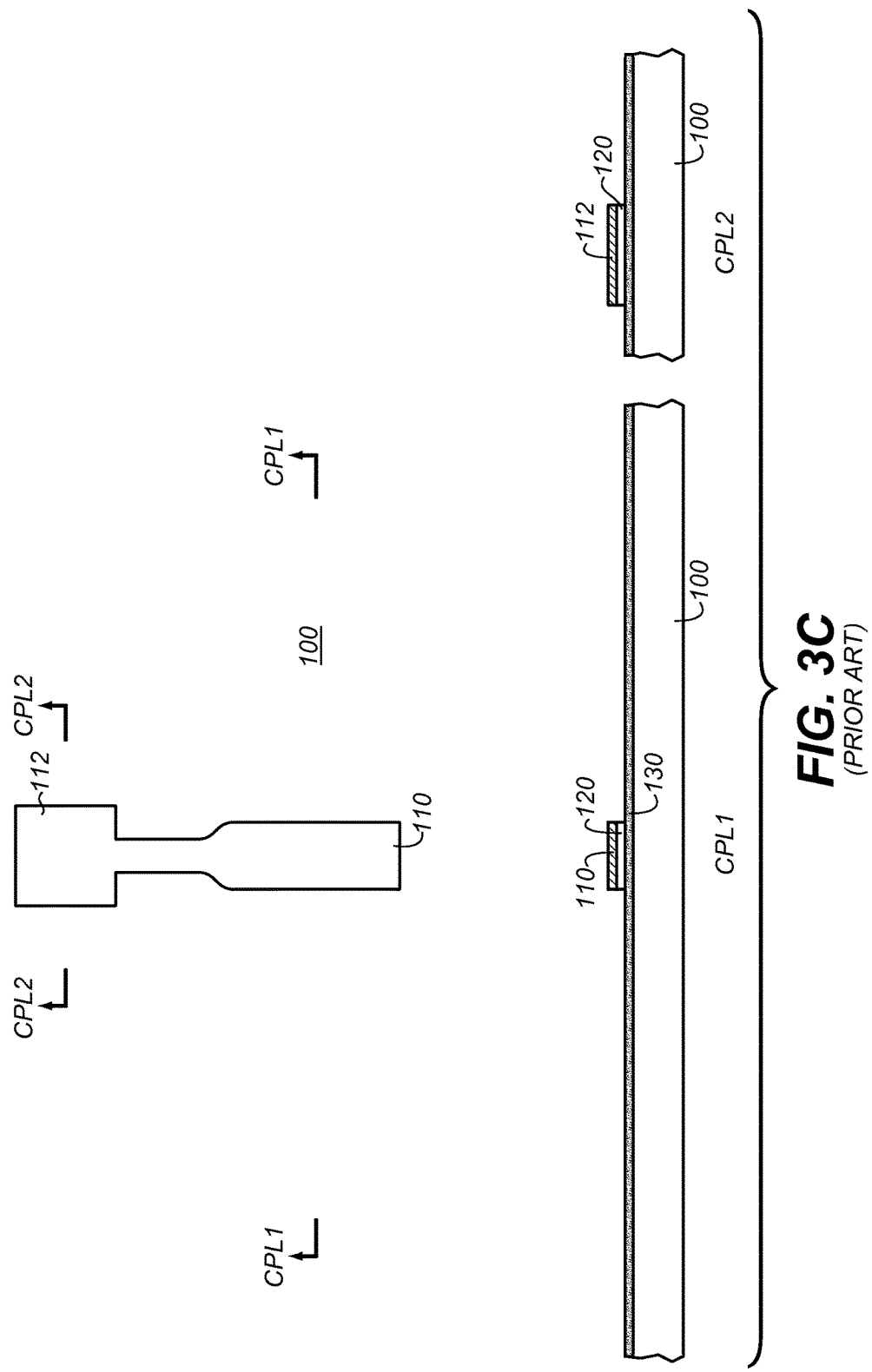
Figure 3E:
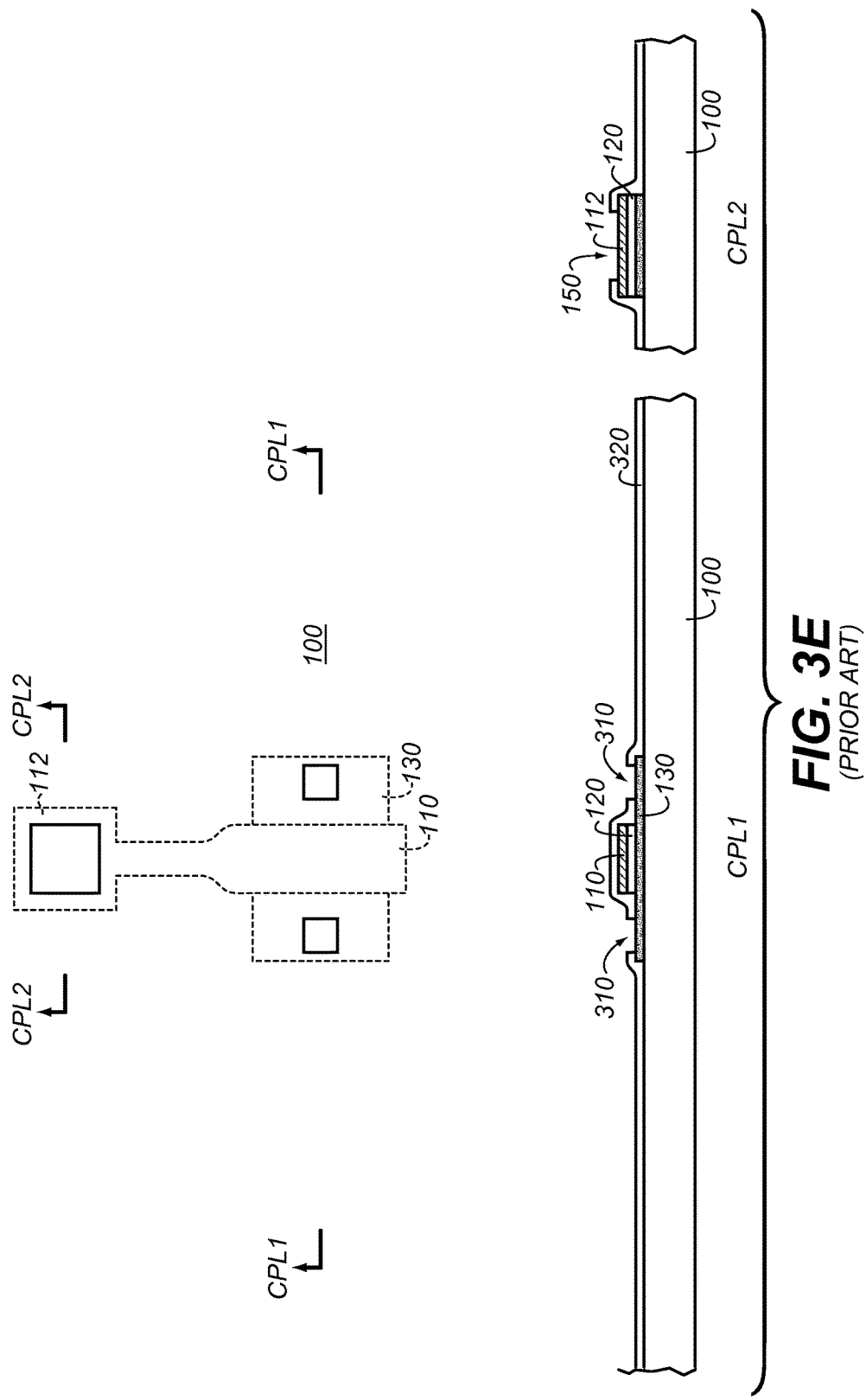

Referring to FIG. 3C, the gate insulator layer 120 is patterned using a self-aligned process, which exposes the active layer material 130 in areas not covered by the gate metal material 300. The resulting structure after this fabrication step is shown in FIG. 3C where the active layer 130 covering the entire insulating substrate 100 is omitted in the top view. Then, using a second photolithography mask, the active layer 130 is patterned to form the transistor active island. The resulting structure after this fabrication step is shown in FIG. 3D. The active layer is then protected by depositing a passivation layer 320 across the entire substrate 100 covering all the previously formed features. The passivation layer 320 must be electrically insulating as otherwise, the passivation layer 320 would form an electrical connection between the gate electrode 110 and the active island. Then, the passivation layer 320 is patterned using a third photolithography mask to open contact windows 310 for preparation in connecting the source and drain electrodes 160 to the active layer 130 and to open gate probe pad window 150. The resulting structure after this fabrication step is shown in FIG. 3E.

Figure 3F:
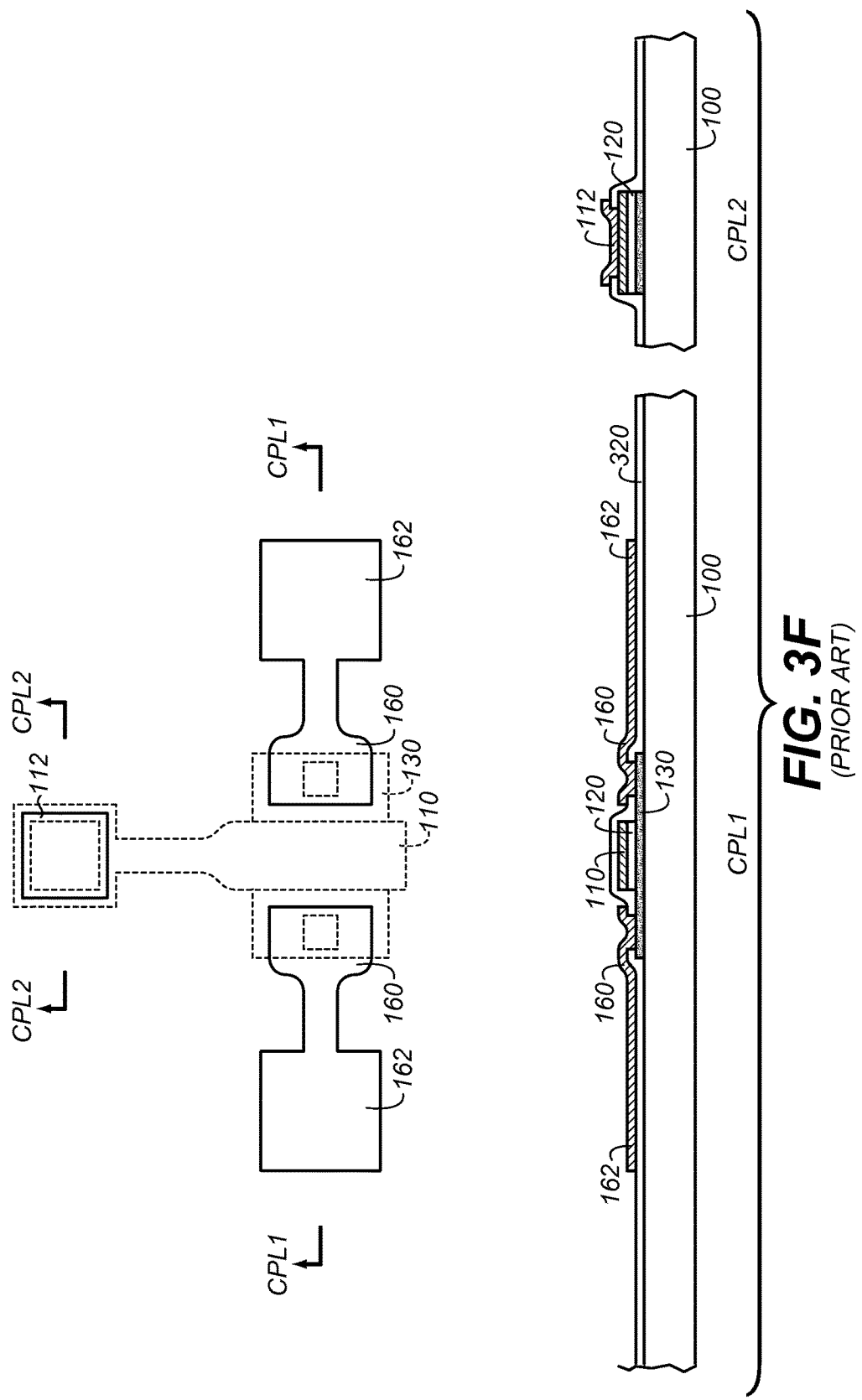
Figure 3G:
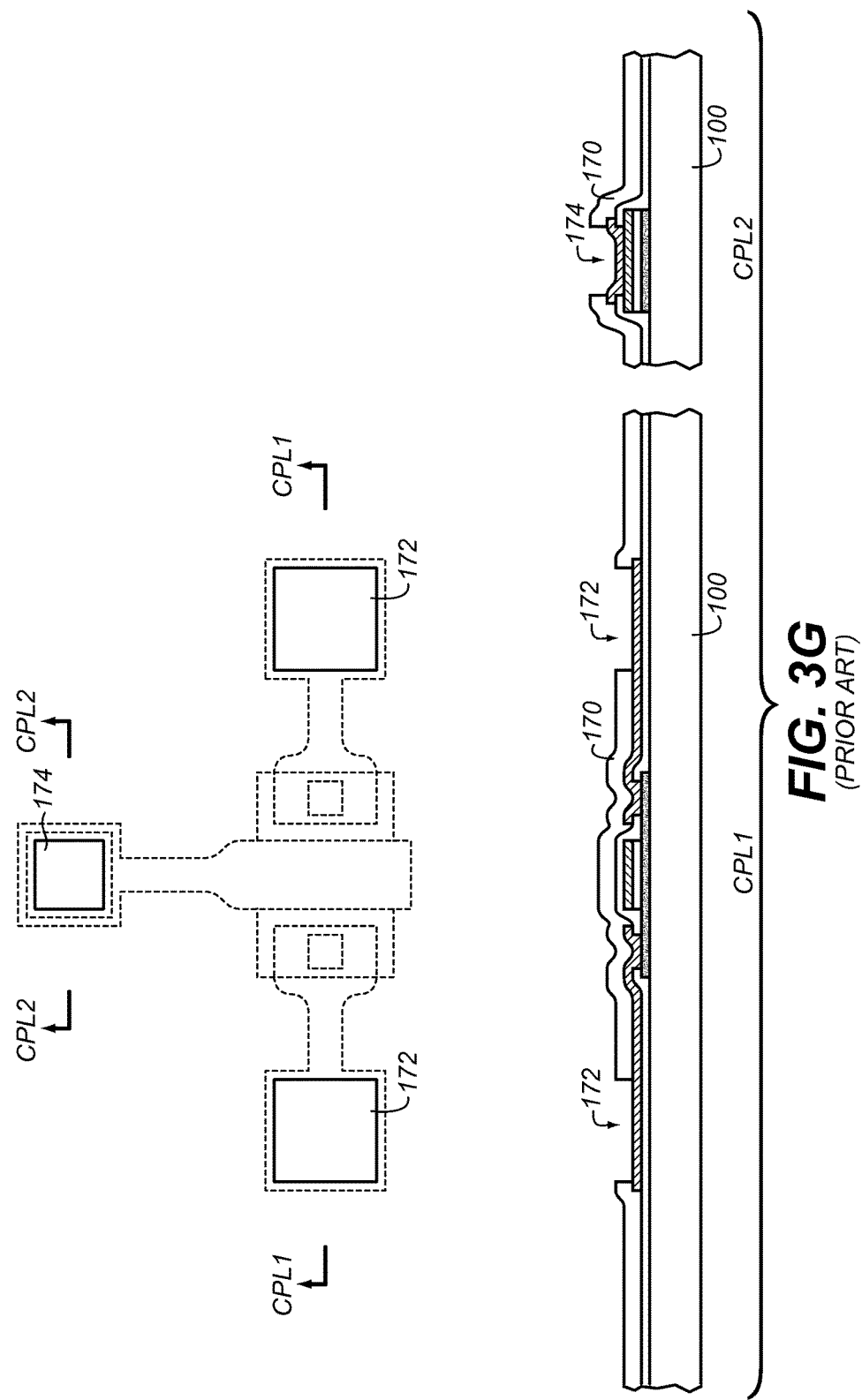

Next, referring to FIG. 3F, the source and drain metal layer is deposited across the entire substrate 100 covering all the previously formed features. This metal layer is then patterned using the fourth photolithography mask to form the source and drain electrodes 160, and the source and drain probe pads 162. Similar to the inverted-staggered TFT architecture, a portion of this metal layer is also left covering the gate probe pad window 150 after patterning. The source and drain electrode metal and the gate electrode metal are electrically connected and together referred to as the gate probe pad 112. The resulting structure after this fabrication step is shown in FIG. 3F. Finally, a blanket passivation layer 170 is formed over the substrate 100 covering all the previously formed features. The passivation layer 170 must also be electrically insulating because otherwise the source and drain terminals 160 would be electrically connected and no transistor action would occur for the fabricated features. In order to make electrical contact to the gate, source, and drain terminals of the coplanar TFT, the electrically insulating layer 170 is patterned by a fifth photolithography mask to open contact windows for the source and drain probe pad windows 172 and the gate probe pad window 174. The resulting structure after this fabrication step is shown in FIG. 3G. At this point, the fabrication process is complete and a total of five photolithography masks used. As shown in the cross-sectional view of FIG. 3G, since the remaining active layer 130 conforms to the substrate 100 surface, the remaining active layer 130 is not subjected to any step covering issue (e.g., caused by the gate electrode 110) as in the inverted-staggered TFT architecture. Since the substrate 100 surface is also relatively smooth and planar, excellent uniformity in the remaining active layer 130 can be achieved, which directly leads to the ability to deposit thinner active layer material, especially in large area arrays. The ability to deposit thinner active layer material is further aided in the coplanar TFT by the absence of the BCE process for the active layer 130. However, compared with the inverted-staggered TFT architecture shown in FIG. 2, the coplanar TFT architecture shown in FIG. 3G requires one additional mask. the additional mask requirement is caused by the via windows used to contact and electrically connect the source and drain electrodes 160 to the active layer 130.

There is a general desire to reduce the number of photolithography masks required in fabrication processes because reducing the number of masks can variously cause the reduction of manufacturing costs. The reduction of manufacturing cost stems from several aspects of the fabrication process. First, the reduction of photolithography masks often leads to the reduction of processing operations or processing steps. As each processing operation requires certain amount of time, reducing the number of operations required can lead to more devices fabricated per unit time, which significantly impacts/reduces the manufacturing cost especially when fabricating in large volumes. Second, it is well known in the TFT fabrication art that prescribed amount or a certain amount of miss-alignment is expected and occurs between photolithography steps. Therefore, the photolithography masks are designed with an alignment margin (e.g., built in tolerances) sufficient to handle the misalignment and ensure device functionality. Design rules are commonly used to refer to feature spacing tolerance within a photolithographic mask or alignment margins in a photolithographic mask sufficient to address and ensure device operability (e.g., electrical contact/insulation between features formed by different masks) between separate photolithography operations in manufacturing a resulting device. As the number of photolithography steps or photolithography masks increase, the total amount of misalignment margin, or acceptable tolerance to misalignment that still yields functional devices, can also increase, which can cause larger TFT and/or resulting device size. Reduction in the mask count can cause the reduction of total alignment tolerances required and may consequently lead to smaller TFT and/or resulting device areas. Since smaller device area leads to more devices fabricated per unit area, manufacturing cost can be lowered by not only reduction in time allocated for the mask alignment, but also smaller total alignment tolerance. Misalignment of the photolithography masks also increases the number of non-functional devices, which reduces the manufacturing yield. The probability of mask misalignment increases with higher mask count; therefore, reducing the mask count also improves manufacturing yield, which can further reduce of manufacturing cost.

In certain exemplary embodiments, an active layer 430 material can be amorphous indium gallium zinc oxide (a-IGZO) semiconductor. To those of ordinary skill in the art, it is evident that there are numerous other possible choices for the active layer 430 material as well as types of materials of which the active layer can be composed and/or include. One of ordinary skill in the art would readily recognize that the same principles are equally applicable to, and can be implemented in, all types of radiographic imaging arrays and/or methods therefore and that any such variations do not depart from the true spirit and scope of exemplary embodiments according to the application.

FIG. 4A to FIG. 4E illustrate top-down views and cross-sectional views of selected processing operations, respectively, for some exemplary method embodiments of forming a thin-film transistor. As shown in FIGS. 4A-4E, CPL1 and CPL2 are cutting-planes lines used to indicate where device cross-sections are drawn. CPL1 illustrates device cross-sectional diagram positions for the TFT and the SD probe pads, and CPL2 illustrates cross-sectional diagram positions for the gate probe pad. For some top-down views in FIGS. 4A-4E, layers are omitted for clarity when the layers are deposited across the entire device or an entire substrate. The cross-sectional views in FIGS. 4A-4E, however, still illustrate the layers omitted for some top-down views.

Figure 4A:
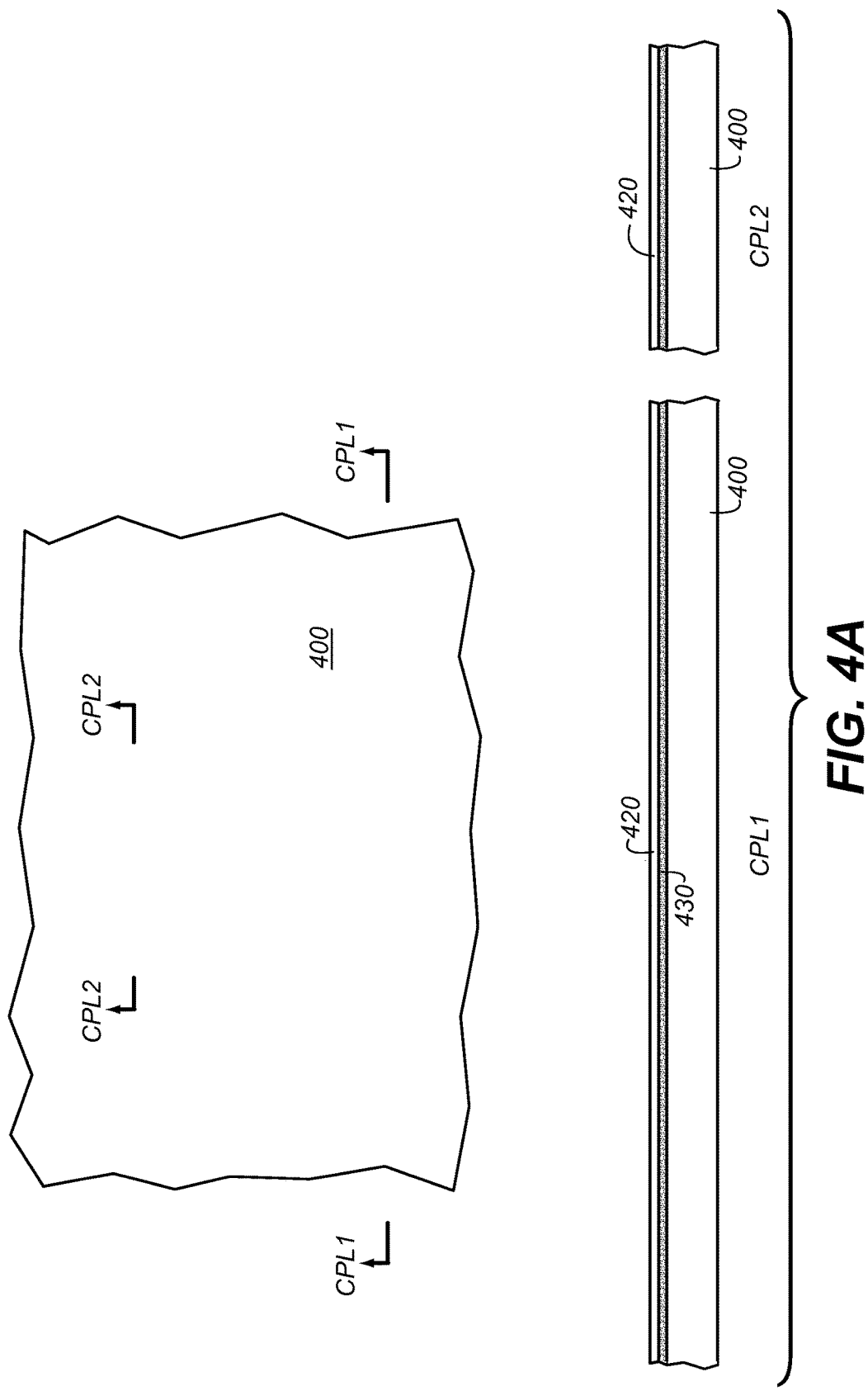
FIGS. 4A-4E are diagrams that show top-down views and cross-sectional views of processing operations for a manufacturing method embodiment of a radiographic imaging array according to the application.

In one exemplary embodiment, referring to FIG. 4A, a process can commence with the deposition of an active layer 430 and a gate insulator layer 420 on top of/over an insulating substrate 400. In one embodiment, the active layer 430 can be an a-IGZO layer. The gate insulator layer can be an insulating layer such as those comprised of silicon dioxide ($SiO_2$) or multiple layers of electrically insulating material such as amorphous silicon nitride (a-SiN), or combinations thereof. The insulating substrate can be a single or multiple layers of materials such as, but not limited to, glass, polyimide, plastic or the like.

Exemplary active layers (e.g., active layer 430) used in certain exemplary TFT embodiments can also be composed of a layer of metal-oxide semiconductor or multiple layers of metal-oxide semiconductor. Exemplary active layers (e.g., active layer 430) can also include various types of metal oxide-based semiconductor materials. Further, amorphous or polycrystalline oxide-based semiconductor materials can be used for the active layers. Any conductive semiconductor material that is sensitive to metal etch can be used for the active layers described herein (e.g., active layer 430).

Figure 4B:
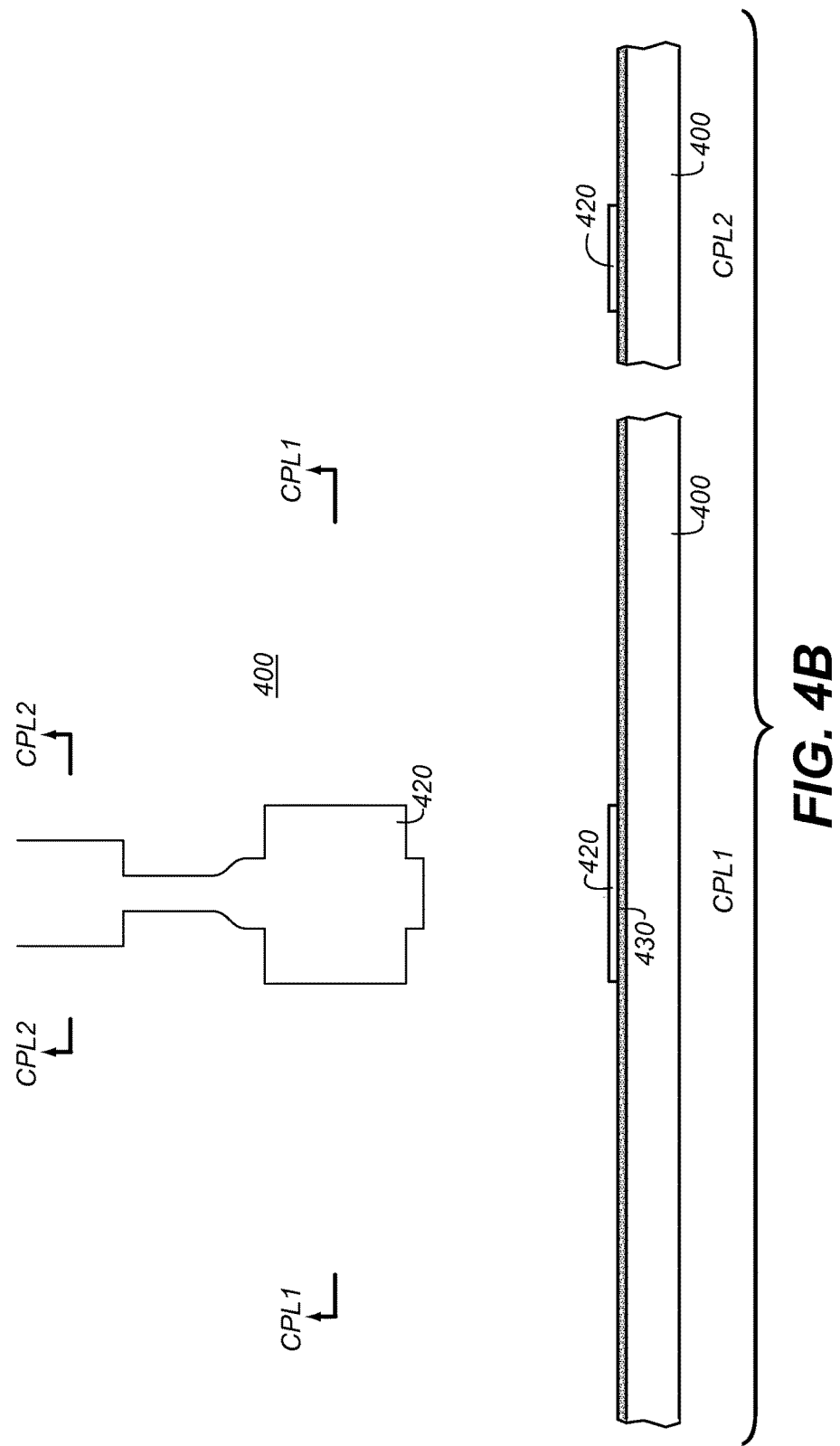

The surface (e.g., the insulating layer 400) adjacent to the active layer 430 can be planar and/or can have relatively low surface roughness. The gate insulator layer 420 and the active layer 430 can preferably be formed consecutively without breaking vacuum, which can improve an interface quality and consequently, can improve electrical properties of the TFT. As shown in FIG. 4B, using a first photolithography mask, the gate insulator layer 420 can be patterned. The pattered insulator layer 420 can function not only as an etch-stopper, but also function as a gate dielectric. The resulting configuration features can be shown in FIG. 4B.

Figure 4C:
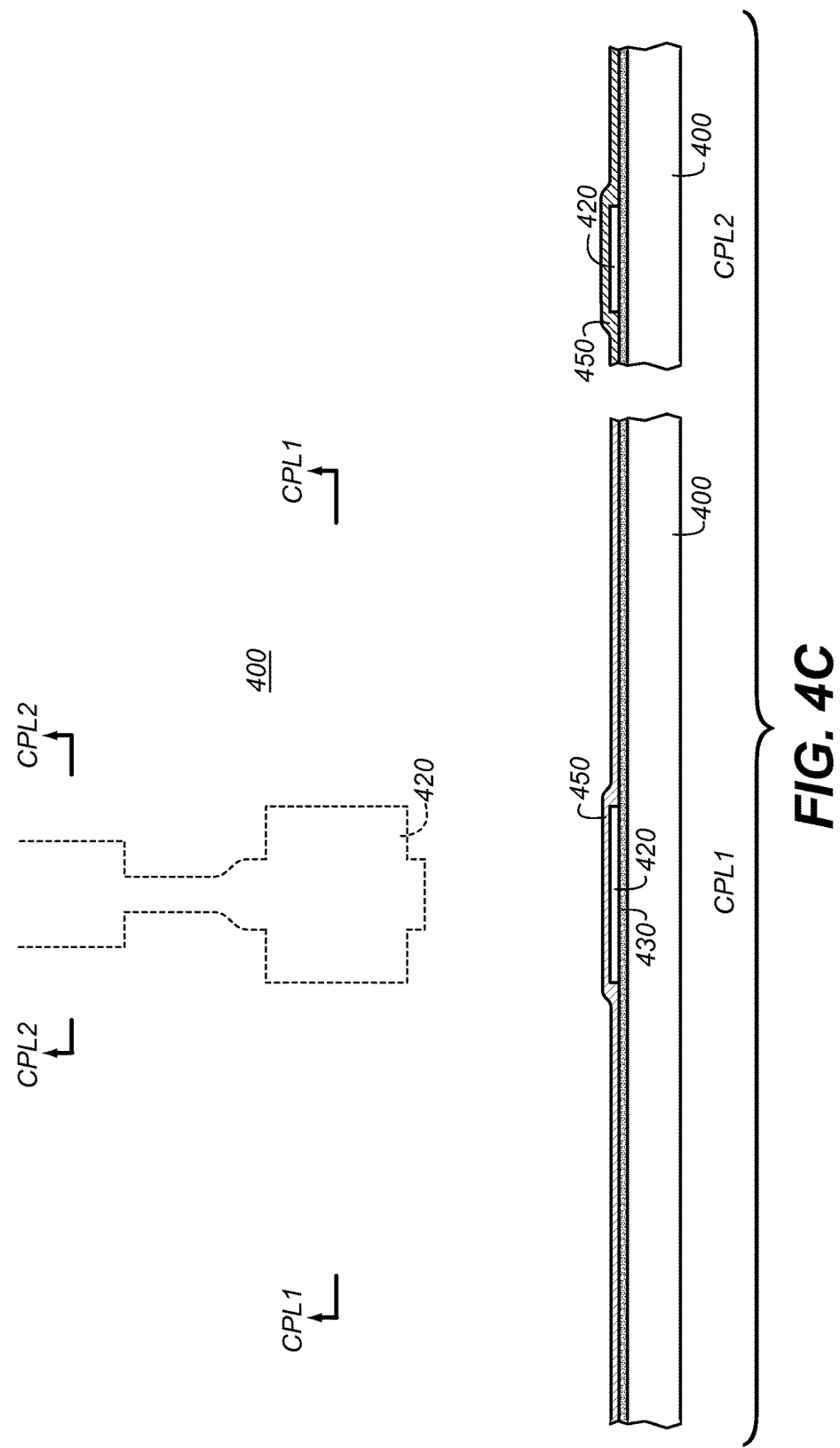

As shown in FIG. 4C, a metal layer 450 can be deposited over the entire substrate 400, covering all the previously formed features; this is shown in FIG. 4C. The metal layer 450 can provide materials used for the gate electrode 410, but also used for source and drain electrodes 460 as well as materials used for corresponding gate probe pads 412 and source and drain probe pads 462. The metal layer 450 can be a combination of a metal layer or multiple metal layers together with various elements to improve layer/performance characteristics such as conductivity.

Figure 4D:
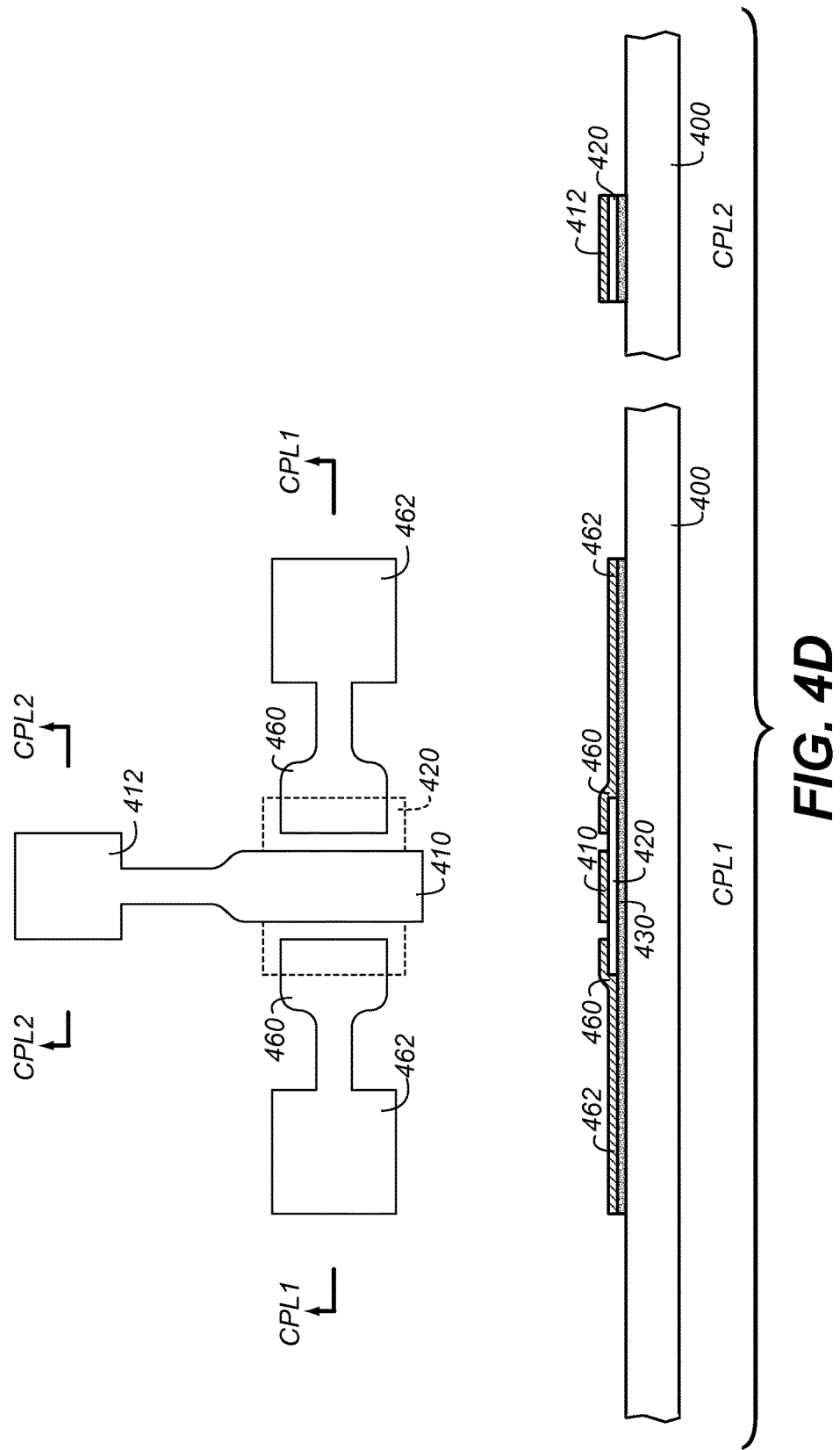
Figure 4E:
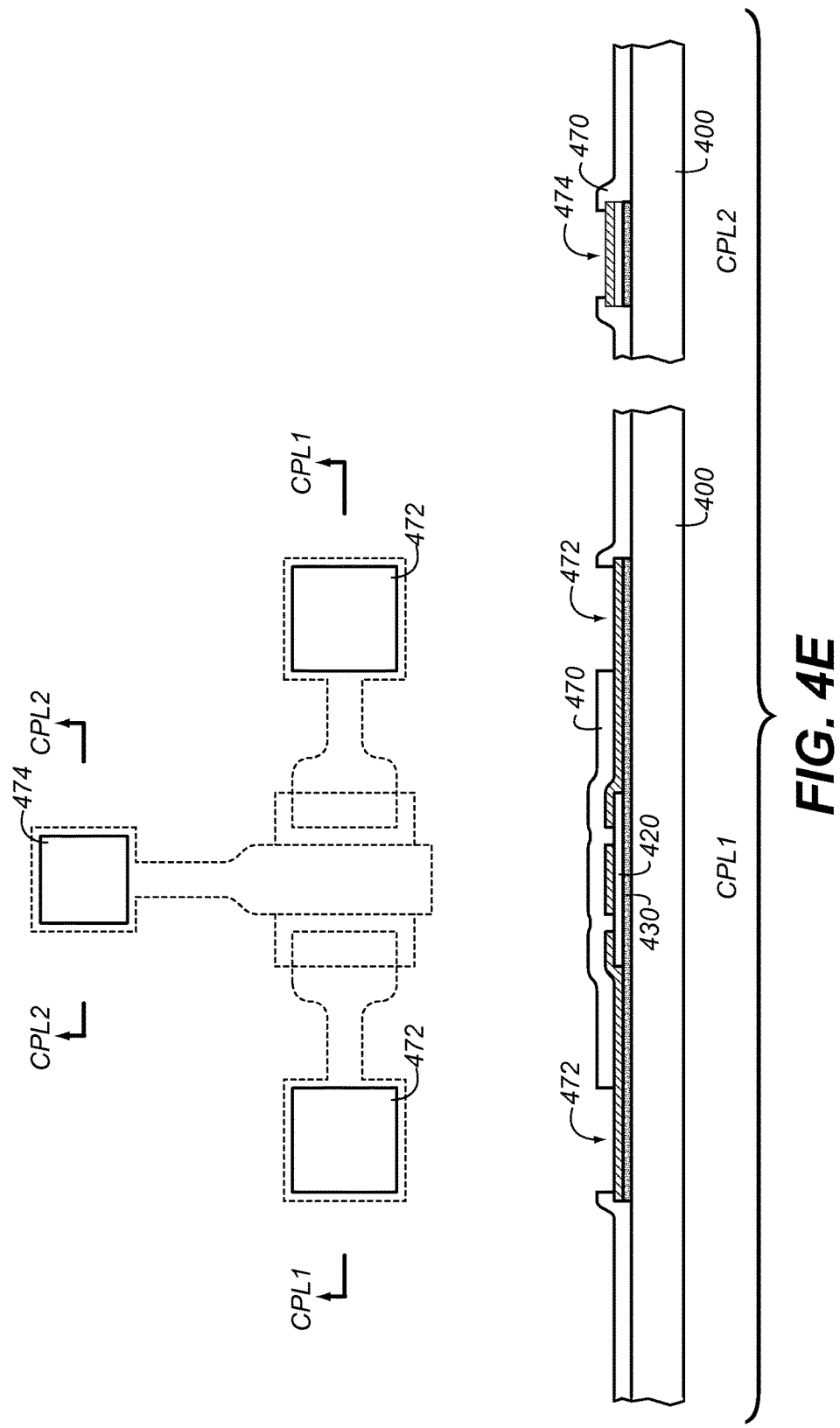

As shown in FIG. 4D, the metal layer 450 can then be patterned using a second photolithography mask to form the gate electrode 410, the source and drain electrodes 460, the gate probe pad 412, and the source and drain probe pads 462. Since the etchant for the metal layer 450 also sufficiently attacks the metal oxide semiconductor layer 430, regions of the active layer 430 not covered by the etch-stopper and the metal material 450 can both be removed (e.g., completely) during the second photolithography mask patterning process. The resulting configuration features can be shown in FIG. 4D.

Then, a protective layer (e.g., passivation layer) 470 can be formed across the entire substrate 400, covering all the previously formed features. The passivation layer 470 can preferably be electrically insulating since otherwise, the passivation layer 470 would electrically connect the terminals of the TFT, rendering the device non-functional or inoperative. In certain exemplary embodiments, to provide electrical coupling or contact the TFT terminals, a third photolithography mask can be used to open the probe pad windows for the source and drain terminals 472, as well as the gate terminals 474. The resulting configuration features can be shown in FIG. 4E. Compared to the inverted staggered TFT architecture described herein in FIGS. 1A-1G and the coplanar TFT architecture described herein in FIGS. 3A-3G, which each use five photolithography masks, certain exemplary embodiments described herein can use only three photolithography masks.

In addition to reduced photolithography mask count, certain exemplary embodiments described herein can also allow or provide for tighter tolerances for misalignment. Exemplary embodiments can provide tighter tolerances at least because all transistor electrodes or all three TFT electrodes can be patterned using a single or the same photolithography mask. Further, since alignment tolerances between different photolithography masks or patterning operations can be larger than the spacing tolerance for a single photolithography mask or patterning operation, at least spacing between the electrodes of a transistor can be made much smaller.

Figure 5A:
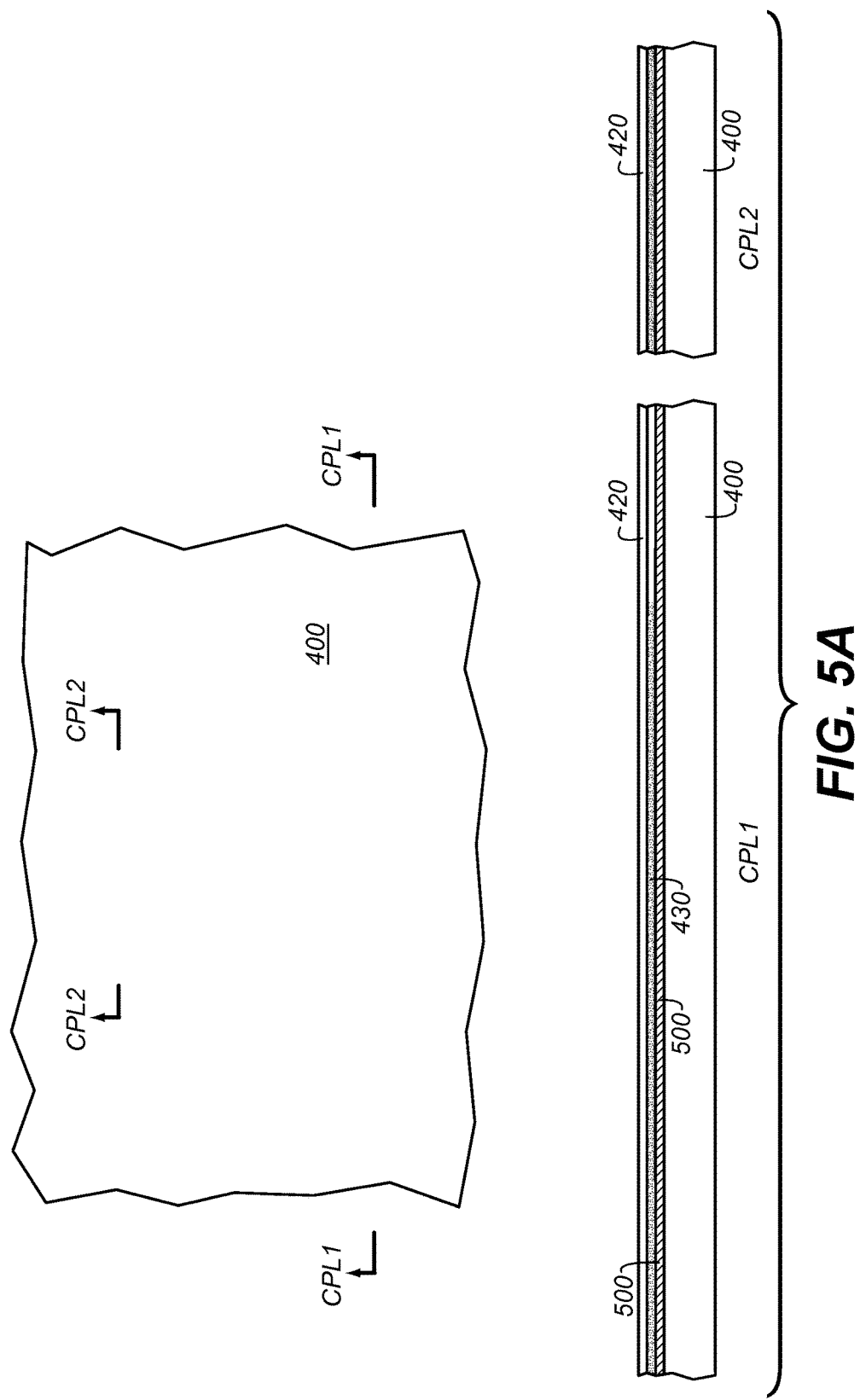
FIGS. 5A-5B are diagrams that respectively show top-down views and cross-sectional views of processing operations for another manufacturing method embodiment of a radiographic imaging array according to the application.
Figure 5B:
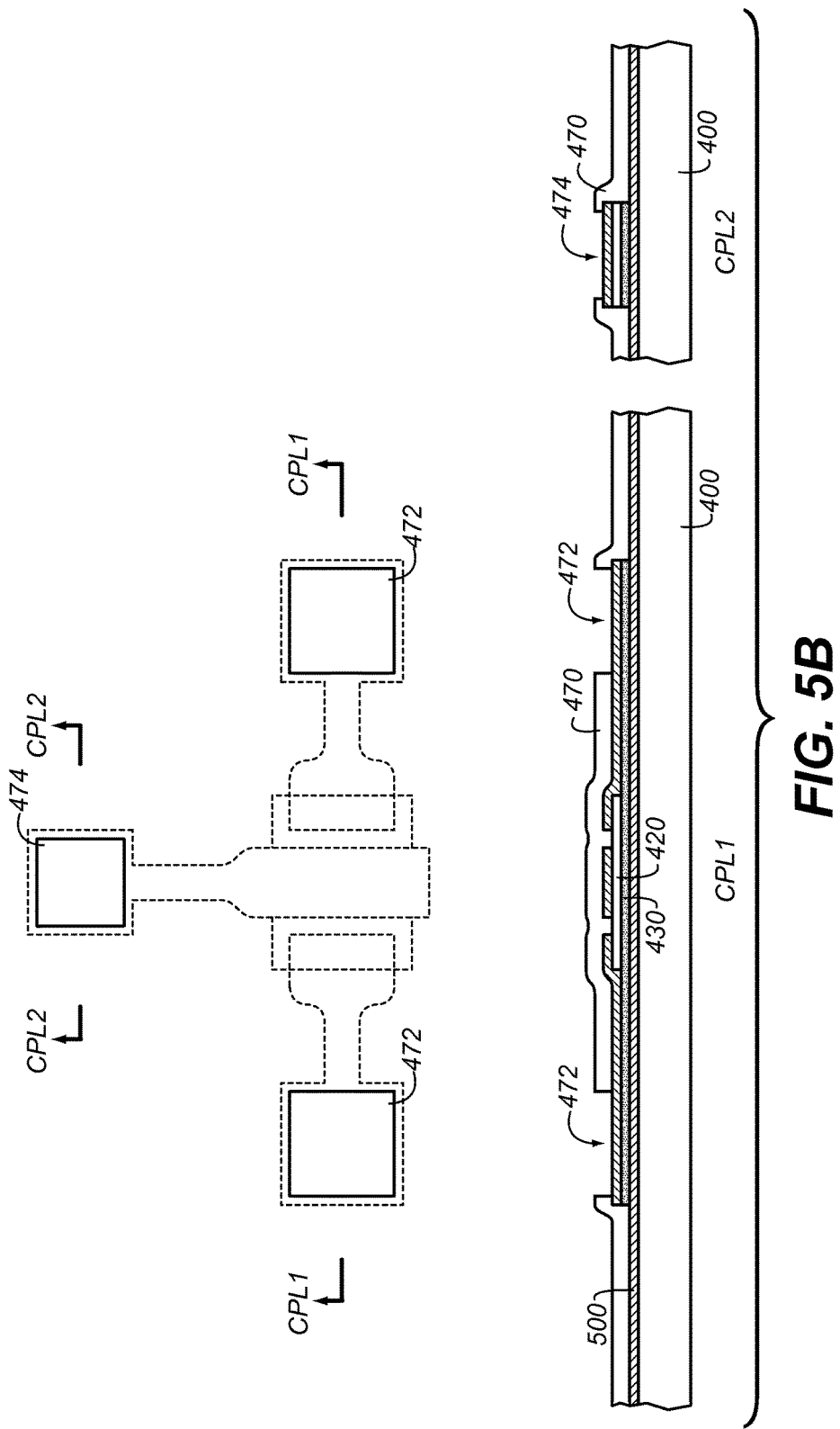

In some exemplary embodiments, an active material (e.g., active layer 430) can be very sensitive to processing conditions and sometimes, contaminants from the substrate 400 can migrate into the active layer causing undesirable effects. FIGS. 5A-5B are diagrams that respectively illustrate top-down views and cross-sectional views of selected processing operations for another exemplary method embodiment of forming a thin-film transistor for a radiographic imaging array of a DR detector. As shown in FIG. 5A, a suitable barrier layer 500 can be inserted between the insulating substrate 400 and the active layer 430. FIG. 5A shows a processing operation where the barrier layer 500, the active layer 430, and the gate insulator layer 420 can be deposited consecutively on the insulating substrate before patterning the gate insulator layer 420. The barrier layer can also be composed of, for example, $SiO_2$, which not only provides good interface properties with the active layer 430 but also can reduce or prevent diffusion of unwanted contaminants from the insulating substrate 400 into the active layer 430. After similar process operations disclosed with respect to FIGS. 4A-4E are performed, the resulting configuration features are shown in FIG. 5B.

Embodiments of radiographic imaging systems, radiographic detectors and/or methods for using the same have various advantages. For example, embodiments can provide TFT for radiographic imaging apparatus having increased or improved performance characteristics.

Figure 6:
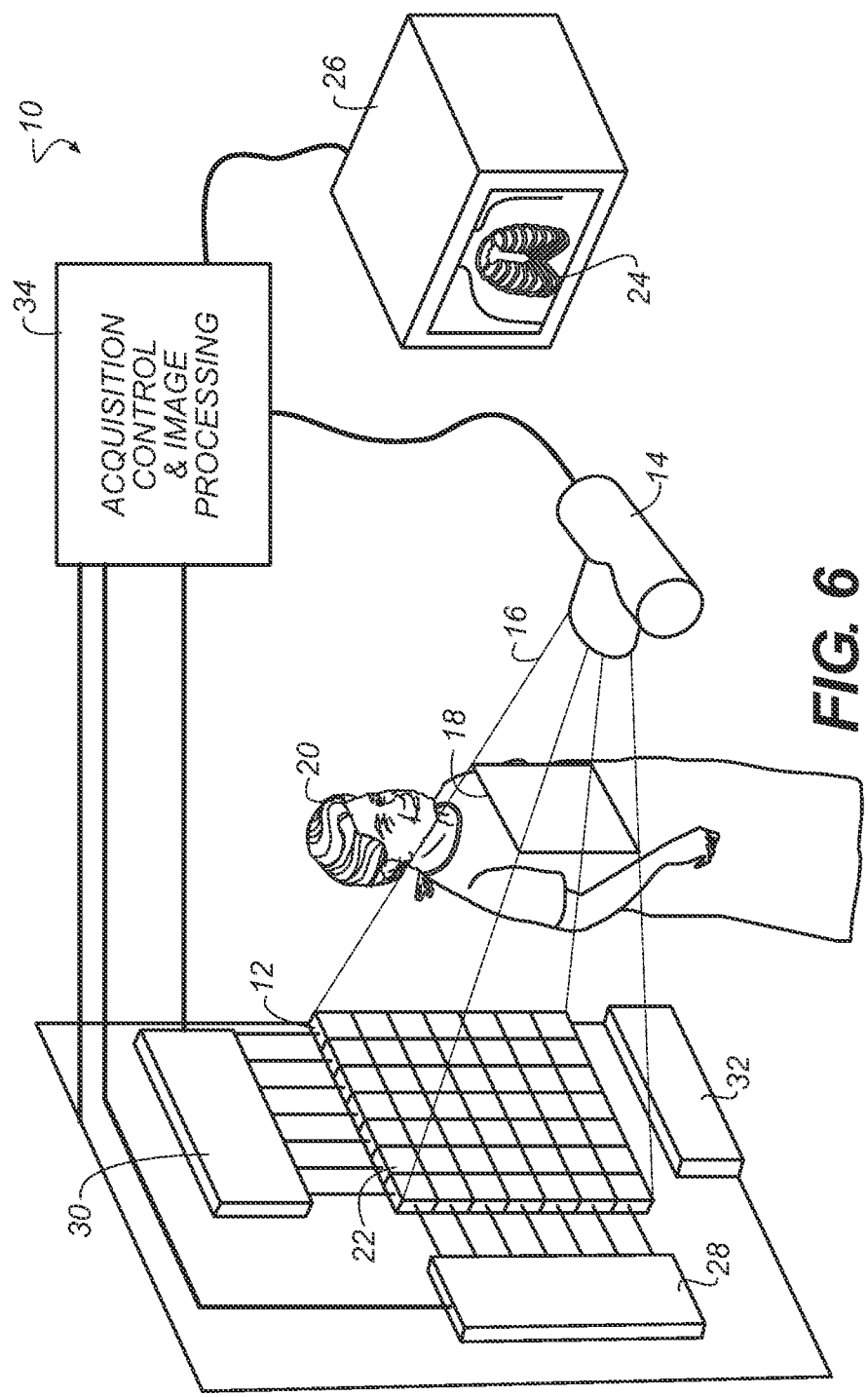
FIG. 6 is a diagram that shows a perspective view of a radiographic imaging apparatus including an area detector according to the application used for a radiographic procedure.

FIG. 6 is a diagram that shows a perspective view of an exemplary radiographic area detector configured to include rows and columns of detector cells in position to receive X-rays passing through a patient during a radiographic procedure. As shown in FIG. 6, an X-ray system 10 that can use an area array 12 can include an X-ray tube 14 collimated to provide an area X-ray beam 16 passing through an area 18 of a patient 20. The beam 16 can be attenuated along its many rays by the internal structure of the patient 20 to then be received by the detector array 12, which can include certain exemplary embodiments of a thin-film transistor described herein, and that can extend generally over a prescribed area (e.g., a plane) perpendicular to the central ray of the X-ray beam 16 (e.g., normal medical imaging operations).

The array 12 can be divided into a plurality of individual cells 22 that can be arranged rectilinearly in columns and rows. As will be understood to those of ordinary skill in the art, the orientation of the columns and rows is arbitrary, however, for clarity of description it will be assumed that the rows extend horizontally and the columns extend vertically.

In exemplary operations, the rows of cells 22 can be scanned one (or more) at a time by scanning circuit 28 so that exposure data from each cell 22 can be read by read-out circuit 30. Each cell 22 can independently measure an intensity of radiation received at its surface and thus the exposure data read-out can provide one pixel of information in an image 24 to be displayed on a display 26 normally viewed by the user. A bias circuit 32 can control a bias voltage to the cells 22.

Each of the bias circuit 32, the scanning circuit 28, and the read-out circuit 30 (e.g., Read Out Integrated Circuits (RO-ICs)), can communicate with an acquisition control and image processing circuit 34 that can coordinate operations of the circuits 30, 28 and 32, for example, by use of an electronic processor (not shown). The acquisition control and image processing circuit 34, can also control the examination procedure, and the X-ray tube 14, turning it on and off and controlling the tube current and thus the fluence of X-rays in beam 16 and/or the tube voltage and hence the energy of the X-rays in beam 16.

The acquisition control and image processing circuit 34 can provide image data to the display 26, based on the exposure data provided by each cell 22. Alternatively, acquisition control and image processing circuit 34 can manipulate the image data, store raw or processed image data (e.g., at a local or remotely located memory) or export the image data.

Examples of image sensing elements used in image sensing arrays 12 include various types of photoelectric conversion devices (e.g., photosensors) such as photodiodes (P-N or PIN diodes), photo-capacitors (MIS), or photoconductors. Examples of switching elements used for signal read-out include exemplary embodiments of thin-film transistors described herein, MOS transistors, bipolar transistors, or FETs.

In an exemplary a-IGZO based indirect flat panel imager, incident X-ray photons are down-converted to lower energy photons, which can be subsequently converted to electron-hole pairs within a-Si NIP photodiodes. The pixel charge capacity of the photodiodes can be a product of the bias voltage and the photodiode capacitance. In general, a reverse bias voltage is applied to the bias lines to create an electric field (e.g., and hence a depletion region) across the photodiodes and enhance charge collection efficiency. The image signal can be integrated by the photodiodes while the associated TFTs are held in a non-conducting ("off") state, for example, by maintaining the gate lines at a negative voltage. A radiographic imaging array can be read out by sequentially switching rows of the TFTs to a conducting state using TFT gate control circuitry. When a row of pixels is switched to a conducting ("on") state, for example by applying a positive voltage to the corresponding gate line, charge from those pixels can be transferred along data lines and integrated by external charge-sensitive amplifiers. After data is read out, the row can then be switched back to a non-conducting state, and the process is repeated for each row until the entire array has been read out. The signal outputs from the external charge-sensitive amplifiers can be transferred to an analog-to-digital converter (ADC) by a parallel-to-serial multiplexer, subsequently yielding a digital image.

The imaging mode described above applies to static radiographic imaging applications, in which isolated single exposures are obtained. A second operating mode would apply to dynamic imaging applications, in which the radiographic exposure is continuous, such as fluoroscopy. In this operating mode the photodiode reset (a) and the exposure period (b) may be eliminated. The photodiodes are continuously exposed and the charge readout is also performed continuously, with the readout also serving to reset both photodiode and the capacitor.

Exemplary embodiments of radiographic imaging, apparatus, radiographic imaging methods and/or methods for making the same described herein provide various advantages. For example, exemplary embodiments and/or electronic semiconductor devices resulting therefrom can reduce photolithography mask counts or photolithography mask steps for TFT devices, require lower alignment tolerances between the TFT electrodes, use a reduced thickness active layer in TFT devices and/or provide a means of fabricating TFT with very thin active layer.

Although embodiments of the application have been shown with a passive pixel architecture that can include a photosensor and a single TFT for the DR imaging array, various passive pixel structures can be used including but not limited to 2 TFTs, 3 TFTs, or more TFTs with at least one photosensor can be used for the pixel described herein.

Exemplary embodiments herein can be applied to digital radiographic imaging panels that use an array of pixels comprising an X-ray absorbing photoconductor and a read-out circuit (e.g., direct detectors). Since the X-rays are absorbed in the photoconductor, no separate scintillating screen is required.

It should be noted that while the present description and examples are primarily directed to radiographic medical imaging of a human or other subject, embodiments of apparatus and methods of the present application can also be applied to other radiographic imaging applications. This includes applications such as non-destructive testing (NDT), for which radiographic images may be obtained and provided with different processing treatments in order to accentuate different features of the imaged subject.

In certain exemplary embodiments, digital radiographic imaging detectors can include thin-film elements such as but not limited to thin-film photosensors and thin-film transistors. Thin film circuits can be fabricated from deposited thin films on insulating substrates as known to one skilled in the art of radiographic imaging. Exemplary thin-film circuits can include a-IGZO devices such as a-IGZO TFTs or a-Si devices such as a-Si PIN diodes, Schottky diodes, MIS photocapacitors, and be implemented using amorphous semiconductor materials, polycrystalline semiconductor materials such as metal oxide semiconductors. Certain exemplary embodiments herein can be applied to digital radiographic imaging arrays where switching elements include thin-film devices including at least one semiconductor layer. Certain exemplary embodiments herein can be applied to digital radiographic imaging arrays where the DR detector is a flat panel detector, a curved detector or a detector including a flexible imaging substrate.

Embodiments of radiographic imaging systems and/or methods described herein contemplate methods and program products on any computer readable media for accomplishing its operations. Certain exemplary embodiments according can be implemented using an existing computer processor, or by a special purpose computer processor incorporated for this or another purpose or by a hardwired system.

Consistent with exemplary embodiments, a computer program with stored instructions that perform on image data accessed from an electronic memory can be used. As can be appreciated by those skilled in the image processing arts, a computer program implementing embodiments herein can be utilized by a suitable, general-purpose computer system, such as a personal computer or workstation. However, many other types of computer systems can be used to execute computer programs implementing embodiments, including networked processors. Computer program for performing method embodiments or apparatus embodiments may be stored in various known computer readable storage medium (e.g., disc, tape, solid state electronic storage devices or any other physical device or medium employed to store a computer program), which can be directly or indirectly connected to the image processor by way of the internet or other communication medium. Those skilled in the art will readily recognize that the equivalent of such a computer program product may also be constructed in hardware. Computer-accessible storage or memory can be volatile, non-volatile, or a hybrid combination of volatile and non-volatile types.

It will be understood that computer program products implementing embodiments of this application may make use of various image manipulation algorithms and processes that are well known. It will be further understood that computer program products implementing embodiments of this application may embody algorithms and processes not specifically shown or described herein that are useful for implementation. Such algorithms and processes may include conventional utilities that are within the ordinary skill of the image processing arts. Additional aspects of such algorithms and systems, and hardware and/or software for producing and otherwise processing the images or co-operating with computer program product implementing embodiments of this application, are not specifically shown or described herein and may be selected from such algorithms, systems, hardware, components and elements known in the art.

While the invention has been illustrated with respect to one or more implementations, alterations and/or modifications can be made to the illustrated examples without departing from the spirit and scope of the appended claims. The term "at least one of" is used to mean one or more of the listed items can be selected. The term "about" indicates that the value listed can be somewhat altered, as long as the alteration does not result in nonconformance of the process or structure to the illustrated embodiment. Finally, "exemplary" indicates the description is used as an example, rather than implying that it is an ideal. Other embodiments of the invention will be apparent to those skilled in the art from consideration of the specification and practice of the invention disclosed herein. It is intended that the specification and examples be considered as exemplary only. The scope of the invention is indicated by the appended claims, and all changes that come within the meaning and range of equivalents thereof are intended to be embraced therein.

What is claimed is:

1. An electronic circuit comprising:
   a substrate;
   an amorphous active layer on a portion of a top surface of the substrate;
   a dielectric layer on a first portion of a top surface of the amorphous active layer;
   a conductive layer on a second portion of the top surface of the amorphous active layer, the conductive layer overlapping the dielectric layer and having edges coextensive with edges of the amorphous active layer; and
   a protective electrically insulating layer over the amorphous active layer, the dielectric layer and the conductive layer, the protective electrically insulating layer directly on the top surface of the substrate and abutting the coextensive edges of both the amorphous active layer and the conductive layer, the protective electrically insulating layer having a plurality of openings therethrough,
   wherein the conductive layer is electrically separated into a source segment, a drain segment and a gate segment, the source and drain segments both on the amorphous active layer and overlapping the dielectric layer, and wherein the plurality of openings in the protective electrically insulating layer each expose a portion of one of the source segment, the drain segment and the gate segment.

2. The circuit of claim 1, wherein the protective electrically insulating layer is a continuous layer over the source segment, the drain segment and the gate segment.

3. The circuit of claim 1, wherein the gate segment is formed entirely on the dielectric layer.

4. The circuit of claim 1, wherein the amorphous active layer comprises a single continuous layer under, and abutting at least a portion of, the first conductive segment, the second conductive segment, and the dielectric layer.

5. The circuit of claim 1, wherein the coextensive edges of the amorphous active layer and the conductive layer are disposed on opposite sides of the amorphous active layer and the conductive layer.

6. The circuit of claim 5, wherein the conductive layer is electrically separated into the segments by a single step of etching through the conductive layer.

7. The circuit of claim 1, wherein the amorphous active layer is disposed on a top surface of the substrate, and wherein the top surface of the substrate comprises silicon dioxide.

8. The circuit of claim 1, wherein the active layer consists of an amorphous homogeneous semiconductor material.

9. A transistor comprising:
   a substrate having a planar top surface;
   a planar amorphous active layer on the planar top surface of the substrate;
   a planar dielectric layer on a top surface of the amorphous active layer;
   a source terminal and a drain terminal each overlapping a portion of the top surface of the amorphous active layer and a portion of a top surface of the planar dielectric layer, the source terminal and the drain terminal each comprising an edge that is coextensive with an edge of the amorphous active layer;
   a gate terminal entirely on the top surface of the planar dielectric layer between the source terminal and the drain terminal, a first gap separating the source terminal from the gate terminal and a second gap separating the drain terminal from the gate terminal; and
   a continuous electrically insulating passivation layer directly on the planar top surface of the substrate, on the gate terminal, on the source terminal, and on the drain terminal, the electrically insulating passivation layer abutting the coextensive edges of the drain terminal and the amorphous active layer and abutting the coextensive edges of the source terminal and the amorphous active layer, the electrically insulating passivation layer comprising three openings wherein each of the openings exposes a portion of a different one of the source terminal, the drain terminal, and the gate terminal.

10. The transistor of claim 9, wherein the dielectric layer is patterned by a first mask, the first and second gaps are patterned by a second mask, and the three openings are patterned by a third mask.

11. The transistor of claim 10, wherein the third mask is the last mask used in a process of fabricating the transistor.

12. The transistor of claim 9, wherein the active layer comprises an amorphous IGZO material.

13. The transistor of claim 9, wherein the amorphous active layer comprises a first edge and a second edge opposite the first edge, the source terminal edge being coextensive with the first edge of the amorphous active layer, and the drain terminal edge being coextensive with the second edge of the amorphous active layer.

14. The transistor of claim 9, wherein the substrate comprises a plurality of layers and wherein a top layer of the substrate comprises a dielectric material.

15. A method of fabricating a transistor, the method comprising:
- providing a substrate;
- forming an active layer over a surface of the substrate;
- forming a dielectric layer on the active layer;
- patterning the dielectric layer, including exposing regions of the active layer;
- forming a conductive layer on the exposed regions of the active layer and on the patterned dielectric layer;
- patterning the conductive layer, including forming distinct gate, source, and drain terminals in the conductive layer over the patterned dielectric layer;
- forming a protective layer on the gate, source, and drain terminals; and
- patterning the protective layer to form a plurality of windows through the protective layer,
- wherein the step of patterning the dielectric layer comprises using a first mask, the step of patterning the conductive layer comprises using a second mask, and wherein the step of patterning the protective layer comprises using a third and final mask to fabricate the transistor.

16. The method of claim 15, wherein the step of patterning the dielectric layer includes forming a continuous dielectric segment.

17. The method of claim 15, wherein the step of patterning the conductive layer includes patterning the active layer and forming common coextensive edges in both the conductive layer and the active layer.

18. The method of claim 15, wherein the step of patterning the conductive layer further includes forming the source and drain terminals on the active layer.

19. A method of fabricating a transistor, the method comprising:
- providing a substrate;
- forming an active layer over a surface of the substrate;
- forming a dielectric layer on the active layer;
- patterning the dielectric layer, including exposing regions of the active layer;
- forming a conductive layer on the exposed regions of the active layer and on the patterned dielectric layer;
- patterning the conductive layer, including forming distinct gate, source, and drain terminals in the conductive layer over the patterned dielectric layer;
- forming a protective layer on the gate, source, and drain terminals; and
- patterning the protective layer to form a plurality of windows through the protective layer,
- wherein the step of patterning the protective layer includes forming a first one of the windows to expose a portion of the source terminal, forming a second one of the windows to expose a portion of the drain terminal, and forming a third one of the windows to expose a portion of the gate terminal.

20. The method of claim 19, wherein the step of patterning the dielectric layer includes forming a continuous dielectric segment.

21. The method of claim 19, wherein the step of patterning the conductive layer includes patterning the active layer and forming common coextensive edges in both the conductive layer and the active layer.

22. The method of claim 19, wherein the step of patterning the conductive layer further includes forming the source and drain terminals on the active layer.

* * * * *